United States Patent [19]
Van Den Brink

[11] Patent Number: 5,801,832
[45] Date of Patent: Sep. 1, 1998

[54] METHOD OF AND DEVICE FOR REPETITIVELY IMAGING A MASK PATTERN ON A SUBSTRATE USING FIVE MEASURING AXES

[75] Inventor: Marinus A. Van Den Brink, Eindhoven, Netherlands

[73] Assignee: ASM Lithography, Veldhoven, Netherlands

[21] Appl. No.: 437,490

[22] Filed: May 9, 1995

Related U.S. Application Data

[63] Continuation of Ser. No. 174,740, Dec. 29, 1993, abandoned, which is a continuation of Ser. No. 42,894, Apr. 5, 1993, abandoned, which is a continuation of Ser. No. 732,514, Jul. 18, 1991, abandoned.

[30] Foreign Application Priority Data

Feb. 7, 1991 [NL] Netherlands ............. 9100215

[51] Int. Cl.$^6$ ..................................... G01B 9/02
[52] U.S. Cl. ..................... 356/358; 356/363; 356/400
[58] Field of Search ................. 356/358, 356, 356/363, 399, 400, 401; 355/53; 33/1 M

[56] References Cited

U.S. PATENT DOCUMENTS

| | | | |
|---|---|---|---|
| 4,643,577 | 2/1987 | Roth et al. | 356/358 |
| 4,655,594 | 4/1987 | Wittekoek et al. | 356/399 |
| 4,778,275 | 10/1988 | Van Den Brink | 356/401 |
| 4,784,490 | 11/1988 | Wayne | 356/358 |
| 4,814,625 | 3/1989 | Yabu | 356/358 |
| 4,881,816 | 11/1989 | Zanoni | 356/358 |
| 5,064,289 | 11/1991 | Bockman | 356/363 |

*Primary Examiner*—Samuel A. Turner
*Attorney, Agent, or Firm*—Steven R. Biren

[57] ABSTRACT

A method is described for repetitively imaging a mask pattern, on separate fields of a substrate (W), for example, for IC manufacture, which substrate fields are positioned without any field-by-field alignment so that the speed of throughput of substrates can be increased. An accurate interferometer system (50, 100, 150) having five measuring axes ($MAX_1$, $MAX_2$, $MAX_3$, $MAX_4$, $MAX_5$) is also described, which system is intended in the first instance for use in an apparatus for performing the method, but which can also be used in a more general way in those cases where an object must be measured in five degrees of freedom.

17 Claims, 16 Drawing Sheets

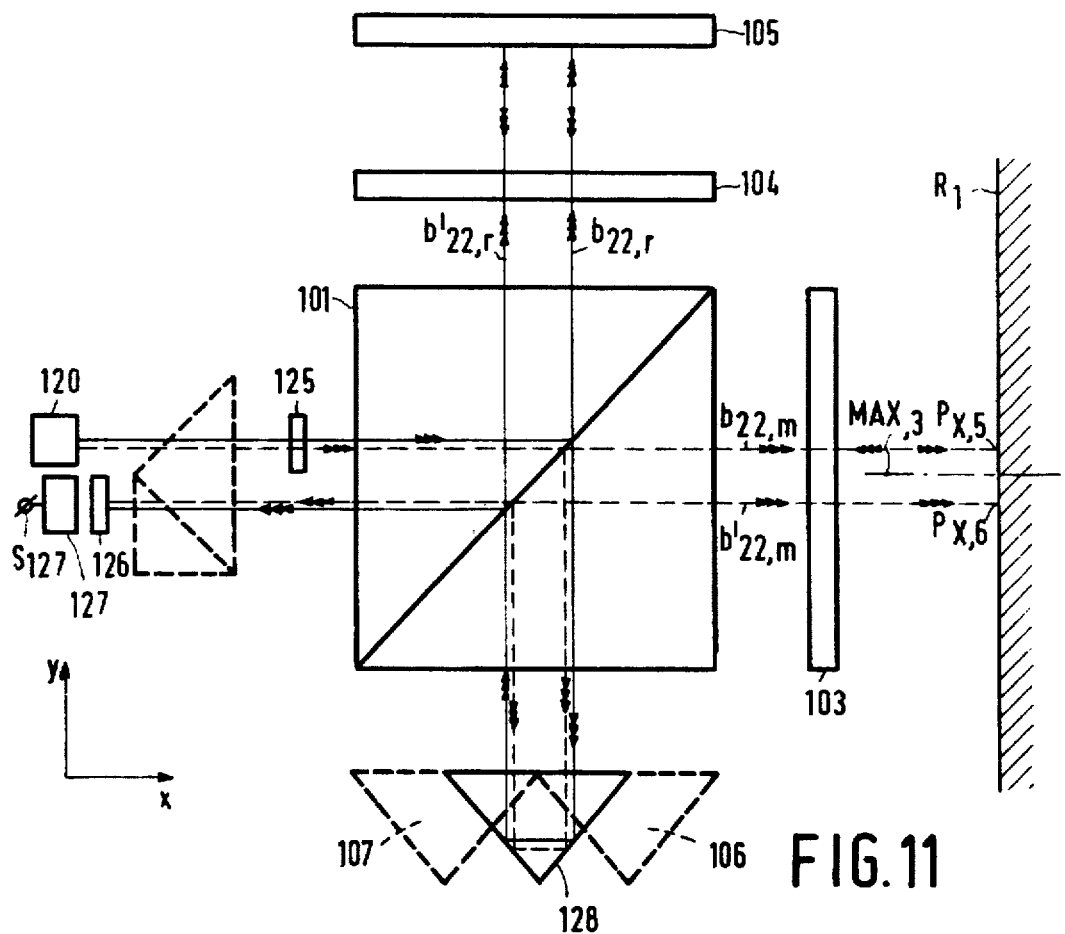
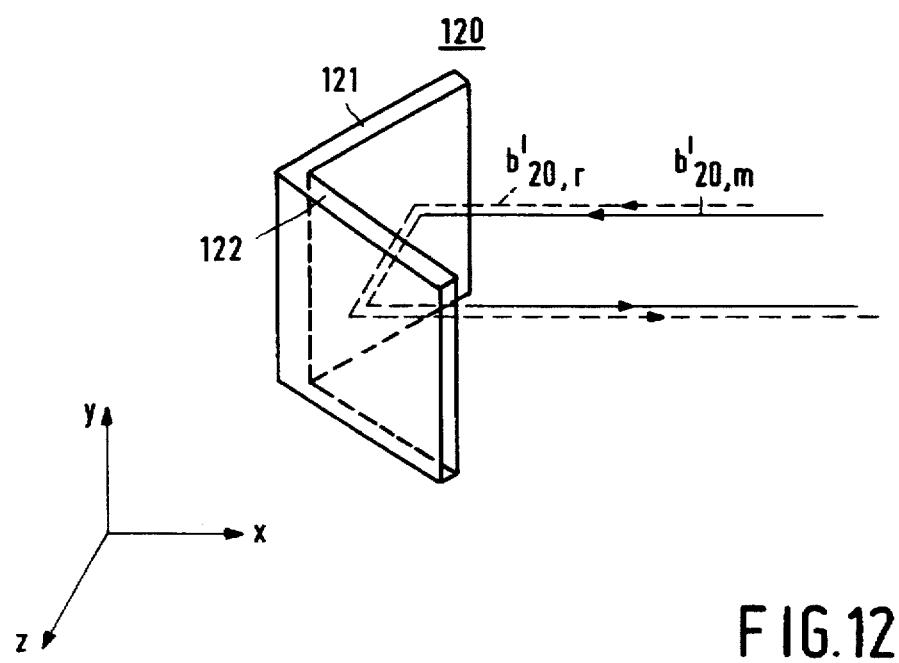
FIG.11
FIG.12

METHOD OF AND DEVICE FOR REPETITIVELY IMAGING A MASK PATTERN ON A SUBSTRATE USING FIVE MEASURING AXES

This is a continuation of application Ser. No. 08/174,740, filed Dec. 29, 1993 which is a continuation of Ser. No. 08/042,894 filed Apr. 5, 1993 which is a continuation of Ser. No. 07/732,514 filed Jul. 18, 1991, all of which are abandoned.

BACKGROUND OF THE INVENTIONS

The invention relates to a method of repetitively imaging, by means of a projection lens system, a mask pattern present in a mask plate each time on a different sub-area of an area on a substrate arranged on a substrate support, the mask pattern and the substrate being accurately positioned with respect to each other while using two mask alignment marks located in the mask plate outside the mask pattern and at least two substrate alignment marks located on the substrate outside said area, said positioning being realised by:

- imaging mask alignment marks and substrate alignment marks onto each another by means of the projection lens system,
- observing the extent of overlap between an alignment mark image and the alignment mark on which the image must be formed,
- displacement along a first (X) axis and a second (Y) axis of a three-axis system of coordinates and possibly rotation about the third (Z) axis of the system of coordinates of the mask pattern and the substrate relative to each other.

The invention also relates to a device for performing the method.

A method and device of this type are described in U.S. Pat. No. 4,778,275 which relates to an apparatus for repetitive and demagnified imaging of a mask pattern, for example, the pattern of an integrated circuit (IC) on one and the same substrate, in which between two successive imaging steps the mask pattern and the substrate are moved with respect to each other, for example, along two mutually perpendicular directions in a plane parallel to the substrate plane and the mask plane.

Integrated circuits are manufactured by means of diffusion and masking techniques. A mask having a first mask pattern is imaged on a number of, for example, 100 sub-areas of a substrate area. Subsequently the substrate is removed from the projection apparatus so as to subject it to the desired physical and/or chemical process steps. The substrate is then introduced into the same or another projection apparatus so as to expose the different sub-areas with a mask having a second mask pattern, and so forth. It must be ensured that the images of the mask patterns are accurately positioned with respect to the sub-areas of the substrate.

Diffusion and masking techniques can also be used when manufacturing other structures having detailed dimensions of the order of micrometers. Structures of integrated optical systems or conductance and detection patterns of magnetic domain memories and a structure of liquid crystal picture display panels are examples. Also in the manufacture of these structures the images of mask patterns must be very accurately aligned with respect to a substrate.

In connection with the large number of electronic components per unit of surface area of the substrate and the attendant small dimensions of these components, increasingly stricter requirements are imposed on the accuracy with which integrated circuits are manufactured. The positions of the images of the successive mask patterns on the substrate must therefore be fixed more and more accurately.

To realise the desired very great positioning accuracy, for example, within several tenths of a micrometer, the apparatus described in U.S. Pat. No. 4,778,275 comprises a device for aligning the substrate with respect to a mask pattern. With this system an alignment mark provided in the substrate and an alignment mark provided in the mask outside the mask pattern are imaged on each other and the mutual positions of the marks are determined. If the image of the one alignment mark coincides with the other alignment mark, the mask pattern is satisfactorily aligned with respect to the substrate at the location of the substrate alignment mark. The main element for imaging a substrate mark and a mask mark onto each other is constituted by the projection lens system with which the mask pattern is projected on the substrate.

Initially, two and possibly several further substrate alignment marks outside the substrate area which must be repetitively illuminated with the mask pattern are aligned with respect to the two mask alignment marks by means of the alignment system. This alignment is known as the global alignment of the substrate.

To enable imaging of the mask pattern on the different sub-areas, the substrate is displaced with respect to the mask in its own plane along two mutually perpendicular axes, the X and Y axes of a system of coordinates. The device described in U.S. Pat. No. 4,778,275 comprises a composite interferometer system with which the X and Y displacement and the rotation about the Z axis ($\phi_z$) of the substrate can be measured. This interferometer system is also referred to as a three-axis interferometer system. The information of the interferometer system is processed together with that of the alignment system so that, when it is ascertained that a substrate alignment mark has been aligned with respect to a mask alignment mark, it is also known where the substrate alignment mark is located in the two-dimensional position matrix which is defined by the interferometer system.

It is not sufficient to use said global alignment of the substrate because the position of each individual substrate sub-area cannot be determined with sufficient accuracy. Moreover, the projection lens system has a small depth of focus and the substrate may exhibit unevennesses so that defocused images which may later result in defects in the manufactured ICs may be produced at the areas of these unevennesses. Therefore it is preferred to measure, before exposure of each substrate sub-area, whether the substrate surface at the location of this sub-area is sufficiently horizontal or sufficiently parallel to the image field and a possible correction is performed by tilting the substrate about the X and/or Y axis. This is known as die-by-die levelling. By locally levelling the substrate, which is realised by tilting the substrate holder, and thus the mirrors of the interferometer attached to the substrate holder, errors may arise in the interferometer signals. Finally, unintentional and uncontrolled tilts of the substrate holder about the X and/or Y axis may occur, which tilts of course also affect the interferometer signals. To enhance the positioning accuracy of the substrate sub-areas and mitigate the consequences of the tilts, it has been proposed for known projection apparatuses, inter alia, the apparatus described in U.S. Pat. No. 4,778,275, to add a separate alignment mark to each sub-area. In addition to global alignment of the substrate, there is also alignment per sub-area after local levelling. The latter is known as field-by-field alignment. However, the field-by-field alignment requires a considerable quantity of extra time so that the substrate throughput of the projection apparatus, i.e. the number of substrates which can be processed per unit of time, is reduced, which is an essential drawback as has been found by the Applicant. Moreover, the sub-area marks cover a part of the substrate surface to be processed so that the number of sub-areas which can be exposed with the mask pattern and hence the number of ICs per substrate will be smaller. This also holds true, though to a lesser extent, if the sub-area alignment marks are reduced in size. However, the mask alignment marks and the alignment marks located outside the substrate area to be illuminated must then also be reduced in size, with the result that the alignment is less accurate.

SUMMARY OF THE INVENTION

The present invention has for its object to eliminate said drawbacks. In accordance with a first aspect of the invention a novel method is provided which is characterized in that each individual substrate sub-area is positioned with respect to the mask pattern without any further alignment and by displacing only the substrate very accurately along at least one of said X and Y axes, in that not only the actual displacement along the X and Y axes and the rotation about the Z axis of the substrate but also tilts of the substrate about the X and Y axes are measured with respect to fixed references and in that all measuring results are used to realise the ultimate positioning of the relevant subarea in the X-Y plane.

This method realises a breakthrough concerning the substrate throughput through an projection apparatus. It is based on the recognition that a considerable gain in time can be achieved by transferring a part of the task of the alignment system to the positioning of the substrate support. This task transfer has become possible because the Applicant has succeeded in enhancing the positioning accuracy of the substrate support, and because now the substrate tilts due to the local levelling of the substrate are taken into account during the X-Y positioning.

For performing the novel method use can be made of a known three-axis interferometer system, such as the system described in U.S. Pat. No. 4,655,594, which Patent only deals with the control and displacement of the substrate holder and does not deal with an alignment system, hence neither with the cooperation between this system and the interferometer system.

As described in U.S. Pat. No. 4,655,594 the chief rays of the interferometer beams must be located in the substrate plane when using a three-axis interferometer system, which means that the mirrors cooperating with the interferometer system should project beyond the substrate plane. Then problems may occur in connection with the available space between the substrate and the projection lens system and with the sufficiently accurate manufacture of the relatively large mirrors. Moreover, such large mirrors considerably increase the weight of the element to be displaced so that the accuracy and the speed with which the substrate support can be positioned is reduced. This is also a reason why an alternative solution of enlarging the mirror holder in such a way that the mirrors always remain outside said space is not a good solution. Another reason is that the direction of the interferometer beams should be even more accurately fixed if the mirrors are further remote from the centre of the image plane of the projection lens system.

An essential improvement of the above-mentioned aspects is obtained with a preferred embodiment of the method which is characterized in that a composite five-axis interferometer system is used for measuring the displacements, the rotation and the tilts of the substrate.

A five-axis interferometer system comprises five measuring axes and five detectors whose output signals can be combined to an X position signal an Y position signal a signal $\phi_x$ indicating the tilt about the X axis a signal $\phi_y$ indicating the tilt about the Y axis a signal $\phi_z$ indicating the rotation about the Z axis.

The result of the tilt measurements can be used in two ways so that there are two embodiments of the method. A first preferred embodiment in which a local levelling is performed for each substrate sub-area is characterized in that the result of the tilt measurements is used to correct the result of the displacement measurements.

A second embodiment of the method is characterized in that the result of the tilt measurements is used to level the substrate.

In addition to said methods, the invention also relates to a device for performing the methods, hence a device which is a part of a projection apparatus for repetitively imaging a mask pattern on a substrate, in which apparatus a so-called levelling detection device is present and in which the substrate is locally levelled.

The inventive idea may, however, also be used in a similar device which is not combined with a levelling device and which is intended to measure and position an object in five degrees of freedom. Examples of similar devices are a device for measuring on separate substrates and masks, a device for positioning a mask table in an apparatus in which a pattern, for example, an IC pattern is written in a mask by means of a laser beam or an electron beam, a device for positioning a substrate table in an apparatus in which a mask pattern is projected on a substrate by means of X-ray radiation, and true measuring devices which are used at many places in industry.

Each device according to the invention for accurately displacing and positioning an object, provided with an object table, an X-Y-$\phi_z$ drive for the object and an interferometer system for measuring displacements along an X axis and an Y axis and a rotation $\phi_z$ about the Z axis of a three-axis system of coordinates is generally characterized in that the interferometer system comprises five measuring axes for the extra measurement of tilts of the object about the X and Y axes and in that the interferometer mirrors are constituted by reflecting side faces of an object support incorporated in the object table for supporting the object in a fixed state.

Since the object is coupled, as it were, optically rigidly with the interferometer system, this device provides the advantage that the movements of the object itself are measured and that the measuring signals are not affected by mutual movements of parts of the object table.

The extra measuring signals in the form of tilt measuring signals are used in different manners in different embodiments of the device.

A first embodiment of the device intended for use in an apparatus providing a local levelling facility, such as a projection apparatus for repetitively imaging a mask pattern on a substrate, is further characterized in that the interferometer measuring mirrors reach at most as far as the surface of an object support on which the object must be arranged and in that an interferometer signal processing unit is provided for converting all interferometer signals into control signals for the X-Y-$\phi_z$ drive.

In this embodiment the tilt measuring signals are used to correct the X and Y displacement measuring signals and the rotation measuring signal for the tilts of the object, for example, a substrate due to the local levelling of this substrate.

The embodiment of the device intended for use outside an apparatus providing a local levelling facility is further characterized in that an interferometer signal processing unit is provided for converting the interferometer signals into control signals for the X-Y-$\phi_z$ drive and into control signals for actuators eliminating tilts of the object.

An object can be very accurately manoeuvred at the desired X and Y positions by means of said devices without the displacement from a desired position to a subsequent position resulting in a tilt about the X or Y axis.

With the interferometer system in which the wavelength of the interferometer beams is used as a standard it is possible to measure said displacements or tilts very accurately, for example, within 5 nm and ½ microrad, respectively, provided that the optical properties of the medium in which the interferometer beams propagate remain constant. Due to variations of the ambient parameters, such as pressure, temperature, humidity and air composition, the refractive index of the medium may change so that the apparent wavelengths of the interferometer beams change and measuring errors may occur.

To prevent this, the displacement and positioning device according to the invention is preferably further characterized in that the interferometer system has a sixth, reference, axis whose measuring beam cooperates with a stationary reflector.

The variation of the refractive index of the medium can be measured by means of this extra measuring beam which is travelling in the same medium as the other interferometer beams. The measuring signal generated by means of the extra measuring beam is applied to the signal processing system so that the results of the X, Y, $\phi_x$, $\phi_y$ and $\phi_z$ measurements can be corrected for changes of the refractive index.

It is to be noted that it is known per se, for example, from European Patent Application no. 0,284,304 to use an extra beam in an interferometer system with which the position of a substrate table is measured so as to measure refractive index changes of the interferometer medium. However, this extra beam cooperates with a separate sub-system, namely a wavelength measuring system having an optical cavity which is closed at the front side and the rear side by a reflector and whose sides have apertures into and out of which the medium can flow. The extra beam is split into two sub-beams one of which is reflected at the front side and the other is reflected at the rear side. The phase difference between the reflected beams is a measure of the optical path length change in the cavity due to the refractive index change caused therein by variations in the medium. Very stringent requirements must then be imposed on the stability of the cavity. Moreover, this cavity is placed at some distance from the measuring beams of the interferometer system. Finally, the interferometer system is an X-Y system, i.e. a two-axis system.

The article: "Ultra-precise mask metrology development and practical results of a new measuring machine" in SPIE vol. 1138 Optical Microlithography and Metrology for Microcircuit Fabrication (1989) pp. 151–157 describes a measuring machine with an interferometer system for measuring the displacements of an object table in which in addition to the actual interferometer beams an extra beam is used for determining refractive index changes in the interferometer medium. The extra beam cooperates with a so-called etalon functioning as an extremely stable reference distance, similarly as the cavity described in European Patent Application no. 0,284,304. The interferometer system described in the SPIE article is also a two-axis system, not a five-axis system. Moreover the reflectors for the reference beams are arranged on the objective system of the measuring machine so that movements of this objective system with respect to the measuring table can be corrected.

In order to enhance the measuring accuracy the device according to the invention may be further characterized in that an air shower for supplying a stream of air having a constant refractive index is provided above the space accommodating the interferometer beams.

This does not only improve the optical quality of the interferometer medium, but it is also achieved that the medium has the same quality at the location of all measuring beams, including the possible reference-axis beam. The air which is blown in is preferably air of a very high degree of purity and of a very constant temperature. If the device is used in an apparatus for repetitively imaging on a substrate, this air can also be used to condition the space accommodating the substrate.

It is to be noted that it is known per se, for example, from the article: "Wafer confinement for control of contamination in micro-electronics" in "Solid State Technology" August 1990, pp. $S_1$-$S_5$ in the manufacture of integrated circuits to check the medium in the space accommodating the substrate accurately by rinsing this space with clean air of a constant temperature. However, this article does not describe an interferometer system for the substrate table, nor does it state anything about checking the interferometer medium.

For each of the five measuring axes of the interferometer system the measuring beam and the reference beam should preferably be satisfactorily parallel to each other after they have been reflected by a mirror of the object table and by a reference mirror, respectively, and combined again by means of a beam splitter. However, due to tilts of the object table about the X, Y and X axes a measuring beam may acquire a direction different from that of the associated reference beam. Instead of one radiation spot, whose total intensity varies from a maximum to a minimum value when the object table is moved in the direction in which the measurement must take place, an interference pattern of light and dark strips is produced within the area of the spot at the location of the detector associated with this measuring beam, which strips are displaced when said object table moves. The movement of these strips and hence of the object table cannot be measured by the detector or can only be measured inaccurately.

A preferred embodiment of the device is therefore further characterized in that in the path of the measuring beam of each measuring axis a retroreflector is arranged, which retroreflector passes said measuring beam, after a first reflection by a mirror of the object support, back to said mirror for a second reflection on said mirror.

Due to this double reflection the original direction of the measuring beam, which direction is parallel to that of the associated reference beam, is maintained, irrespective of the tilts of the object support.

It is to be noted that the use of a retroreflector for realising a twofold reflection of a measuring beam in an interferometer system is known per se, inter alia from the article "Linear/angular displacement interferometer for waferstage metrology" in: "SPIE vol. 1088 Optical/Laser Microlithography II" 1989, pp. 268–272. However, the interferometer system described in this article is not a five-axis system but a three-axis system.

The device according to the invention is preferably further characterized in that the interferometer system comprises a first and a second interferometer unit, the first unit supplying the measuring beams for measuring along three measuring axes and the second unit supplying the measuring beams for measuring along two measuring axes.

Due to this division of the interferometer system an optimum degree of space occupation and complexity is achieved.

An interferometer unit is a constructive unit which comprises a plurality of polarization-sensitive or insensitive beam splitters, a plurality of polarization rotators and a plurality of detectors.

A preferred embodiment of this device is characterized in that the measuring beam for the reference axis comes from the second interferometer unit.

In this embodiment the required measuring beams are uniformly distributed over the interferometer units so that these units have the same construction as much as possible.

To enhance the measuring accuracy, the device is preferably further characterized in that the reference mirror for the reference axis is fixedly connected to the second interferometer unit.

In principle, any interferometer unit may have its own radiation source. However, the device is preferably further characterized in that the two interferometer units have a common radiation source.

As a result, the device can be implemented in a simpler and less expensive manner.

To obtain accurate measuring signals having high signal-to-noise ratios, the device may be further characterized in that the radiation source is a laser source supplying two beam comutually perpendicent frequencies and mutually perpendicular directions of polarization.

A so-called heterodyne detection can then be used, which considerably contributes to the measuring accuracy. However, it is alternatively possible to use an interferometer system which utilizes the phase difference between a measuring beam and a reference beam, which beams are associated with one and the same measuring axis.

Finally the invention relates to an apparatus for repetitively imaging a mask pattern on a substrate, which apparatus can work faster and more accurately than known apparatuses due to using the inventive concept. This apparatus, which comprises a mask holder, a substrate table with a substrate support, a projection lens system arranged between the mask holder and the substrate support, an alignment device for globally aligning the substrate with respect to the mask pattern, a levelling device for locally levelling the substrate and a displacement and positioning device for the substrate, is characterized in that the displacement and positioning device is a device as described hereinbefore which can successively be driven in a first mode, in which the substrate is globally positioned with respect to the mask pattern by means of the alignment and interferometer measuring signals, and in a second mode in which a sub-area of the substrate is positioned with respect to the mask pattern by means of the interferometer measuring signals only.

BRIEF DESCRIPTION OF THE DRAWINGS

Embodiments of the invention will now be described in greater detail with reference to the accompanying drawings in which FIGS. 10 and 11 show a first embodiment of a three-axis interferometer unit in accordance with two cross-sections in different XY planes, FIG. 12 shows a reflector system for this embodiment.

DESCRIPTION OF THE PREFERRED EMBODIMENTS

Figure 1:
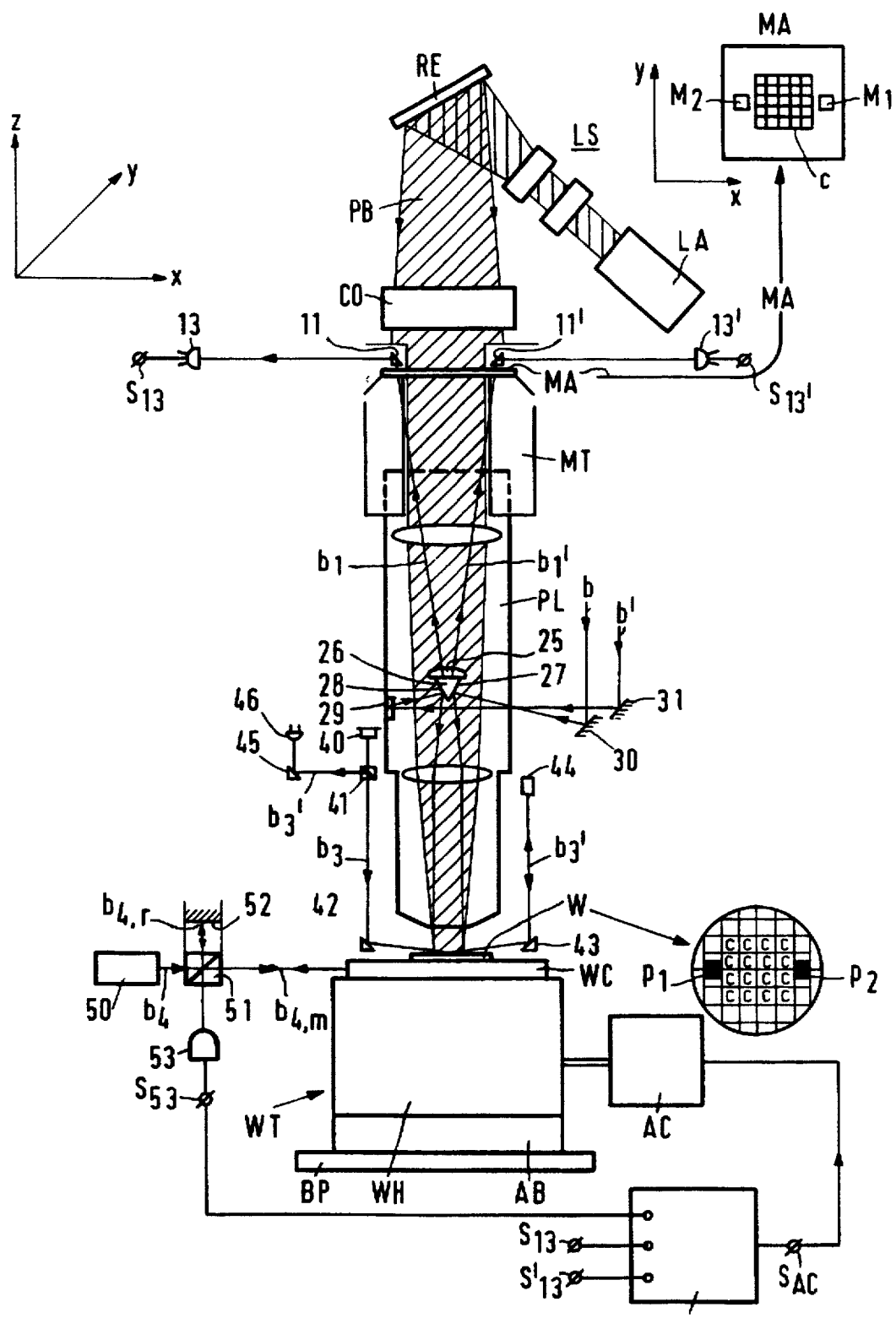
FIG. 1 shows an embodiment of an apparatus for repetitively imaging a mask pattern on a substrate.

FIG. 1 shows the optical elements of an embodiment of an apparatus for repetitively imaging a mask pattern on a substrate. The main components of this apparatus are a projection column in which a mask pattern C to be imaged is provided and a movable substrate table WT with which the substrate can be positioned with respect to the mask pattern C. The apparatus further has an illumination system which comprises a radiation source LA, for example, a Krypton-Fluoride Excimer Laser, a lens system LS, a mirror RE and a condensor lens CO. The projection beam illuminates the mask pattern C which is present in the mask MA, which mask is arranged on a mask table MT.

The beam PB passing through the mask pattern C traverses a projection lens system PL arranged in the projection column and shown only diagrammatically, which system forms an image of the pattern C on the substrate W. The projection lens system has a magnification of, for example, $M=\frac{1}{5}$, a numerical aperture NA=0.48 and a diffraction-limited image field having a diameter of 21.2 mm. The substrate is held by a substrate support WC which forms part of a substrate table WT which is only shown diagrammatically.

The apparatus further comprises a plurality of measuring devices, namely a device for aligning the mask MA with respect to the substrate W in the XY plane, an interferometer system for determining the position and orientation of the substrate holder and hence of the substrate, and a focus error detection device for determining a deviation between the focal or image plane of the projection lens system PL and the surface of the substrate W. These measuring devices are parts of servosystems which comprise electronic signal processing and control circuits and drivers or actuators with which the position and orientation of the substrate and the focusing can be corrected with reference to the signals supplied by the measuring devices.

The alignment device uses two alignment marks $M_1$ and $M_2$ in the mask MA, indicated in the top right corner of FIG. 1. These marks preferably consist of diffraction gratings, but they may be alternatively formed by other marks, such as squares or strips which are optically different from their surroundings. The alignment marks are preferably two-dimensional, i.e. they extend in two mutually perpendicular directions, the X and Y directions in FIG. 1. The substrate W, for example, a semiconductor substrate on which the pattern C must be imaged side by side several times, has a plurality of alignment marks, preferably also two-dimensional diffraction gratings, two of which, $P_1$ and $P_2$ are shown in FIG. 1. The marks $P_1$ and $P_2$ are located outside the areas on the substrate W where the images of the pattern C must be formed. The grating marks $P_1$ and $P_2$ are preferably phase gratings and the grating marks $M_1$ and $M_2$ are preferably amplitude gratings.

Figure 2:
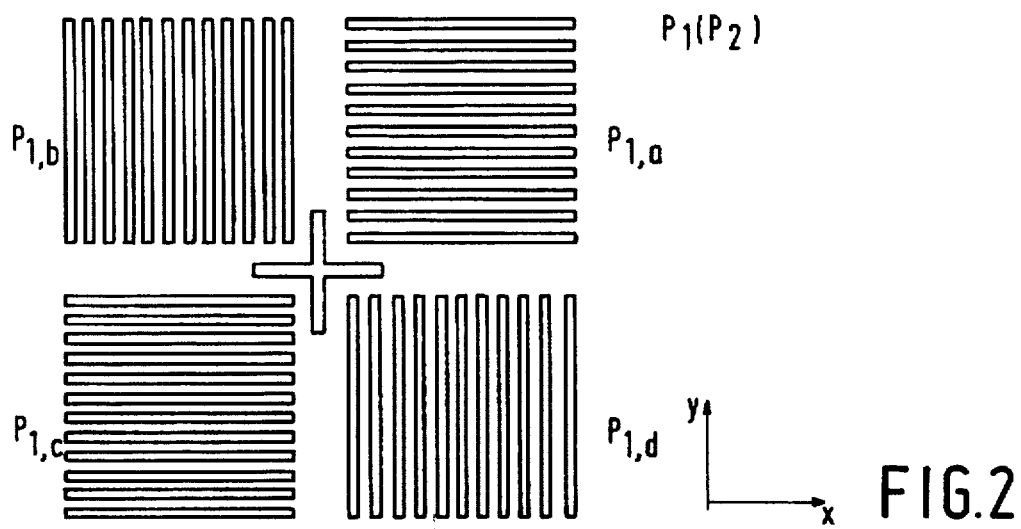
FIG. 2 shows a known embodiment of an alignment mark in the form of a two-dimensional grating.

FIG. 2 shows an embodiment of one of the two identical substrate phase gratings on a larger scale. Such a grating may comprise four sub-gratings $P_{1,a}$, $P_{1,b}$, $P_{1,c}$ and $P_{1,d}$, two of which, $P_{1,b}$ and $P_{1,d}$ serve for alignment in the X direction and the two other ones, $P_{1,a}$ and $P_{1,c}$ serve for alignment in the Y direction. The two sub-gratings $P_{1,b}$ and have a grating period of, for example 16 μm and the sub-gratings $P_{1,a}$ and $P_{1,d}$ have a grating period of, for example 17.6 μm. Each sub-grating may have a dimension of, for example 200×200 μm. An alignment accuracy which is in principle smaller than 0.1 μm can be achieved with this grating and a suitable optical system. Different grating periods have been chosen so as to enlarge the capture range of the alignment device.

FIG. 1 shows a first embodiment of an alignment device, namely a double alignment device in which two alignment beams b and b' are used for aligning the substrate alignment mark $P_2$ on the mask alignment mark $M_2$, and the substrate alignment mark $P_1$ on the mask alignment mark $M_1$, respectively. The beam b is reflected by a reflecting element 30, for example, a mirror to the reflecting surface 27 of a prism 26. The surface 27 reflects the beam b to the substrate alignment mark $P_2$ which passes a part of the radiation as beam $b_1$ to the associated mask alignment mark $M_2$ where an image of the mark $P_2$ is formed. A reflecting element 11, for example, a prism is arranged above the mark $M_2$, which prism directs the radiation passed by the mark $M_2$ towards a radiation-sensitive detector 13.

The second alignment beam b' is reflected by a mirror 31 to a reflector 29 in the projection lens system PL. This reflector 29 passes the beam b' to a second reflecting surface 28 of the prism 26, which surface directs the beam b' onto the substrate alignment mark $P_1$. This mark reflects a part of the radiation of the beam b' as beam $b_1'$ to the mask alignment mark $M_1$ where an image of the mark $P_1$ is formed. The radiation of the beam $b_1'$ passing through the mark $M_1$ is directed to a radiation-sensitive detector 13' by a reflector 11'.

Figure 3:
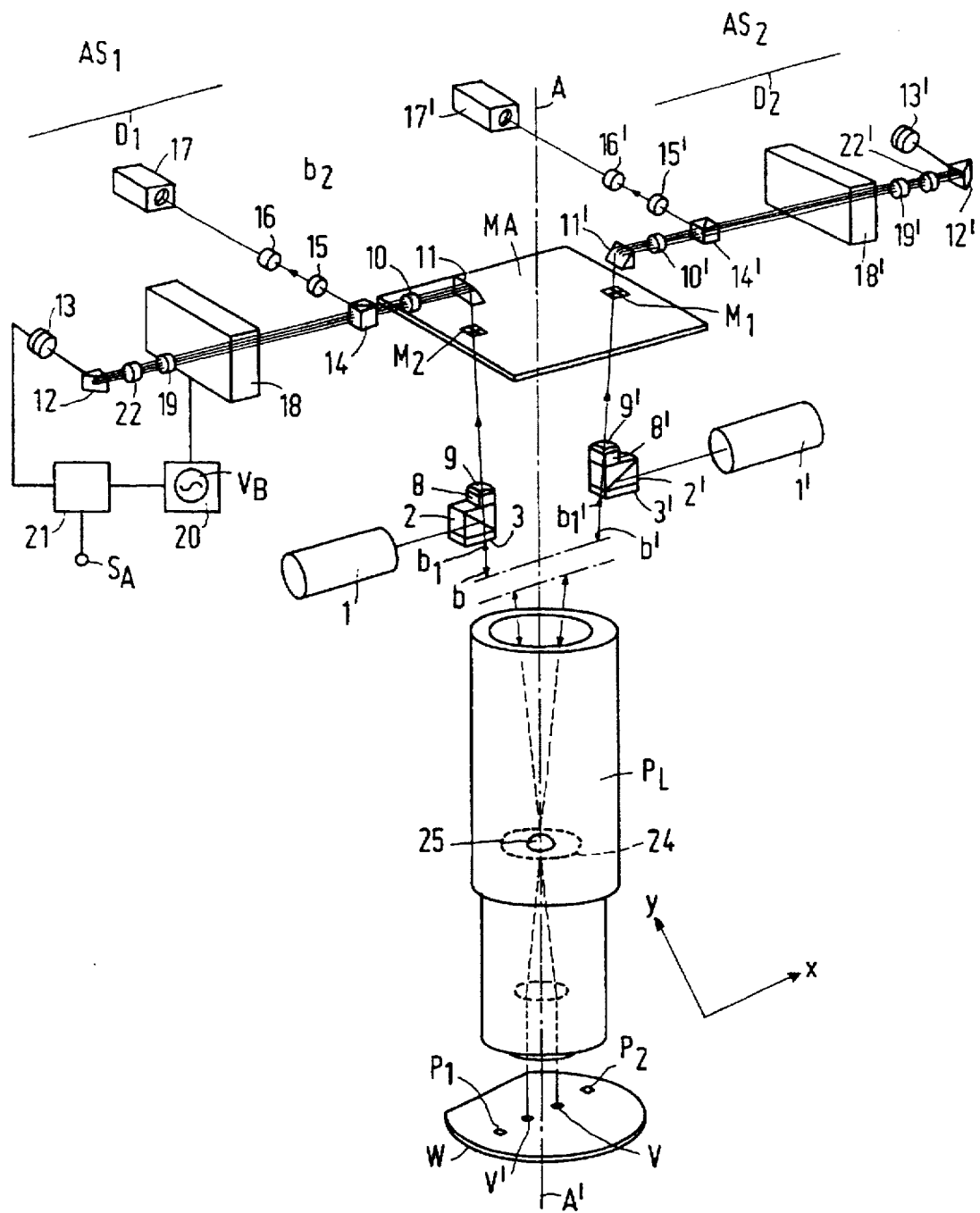
FIG. 3 shows an embodiment of the apparatus using two alignment devices.

The operation of the double alignment device will now be described with reference to FIG. 3 showing an embodiment of such a device which is distinguished from that shown in FIG. 1 by the different way of coupling the alignment beams b and b' into the projection lens system. There are two separate and identical alignment systems $AS_1$ and $AS_2$ which are positioned symmetrically with respect to the optical axis AA' of the projection lens system PL. The alignment system $AS_1$ is associated with the mask alignment mark $M_2$ and the alignment system $AS_2$ is associated with the mask alignment mark $M_1$. The corresponding elements of the two alignment systems are denoted by the same reference numerals, those of the system $AS_2$ being distinguished from those of the system $AS_1$ by their primed notation.

The alignment system $AS_1$ comprises a radiation source 1, for example, a Helium-Neon Laser which emits an alignment beam b. This beam is reflected towards the substrate W by a beam splitter 2. The beam splitter may be a partially transparent mirror or a partially transparent prism, but it is preferably a polarization-sensitive splitting prism followed by a λ/4 plate 3, in which λ is the wavelength of the beam b. The projection lens system PL focuses the beam b in a small radiation spot V having a diameter of the order of 1 mm on the substrate W. This substrate reflects a part of the beam as beam $b_1$ towards the mask M. The beam $b_1$ traverses the projection lens system PL, which system images the radiation spot V on the mask. Before the substrate is arranged in the illumination apparatus, it has been prealigned in a prealignment station coupled to the apparatus, for example, the station described in European Patent Application no. 0,164,165, such that the radiation spot V is located on the substrate mark P2. This mark is then imaged by the beam $b_1$ on the mask mark $M_2$. The dimension of the mask mark $M_2$ is adapted to that of the substrate mark $P_2$ whereby the magnification M of the projection lens system has been taken into account, so that the image of mark $P_2$ accurately coincides with the mark $M_2$ if the two marks are mutually positioned correctly.

On its path to and from the substrate W the beams b and $b_1$ have traversed the λ/4 plate 3 twice, whose optical axis extends at an angle of 45° to the direction of polarization of the linearly polarized beam b emitted by the source 1. The beam $b_1$ passing through the λ/4 plate then has a direction of polarization which is rotated 90° with respect to the beam b so that the beam $b_1$ is passed by the polarization splitting prism 2. The use of the polarization splitting prism in combination with the λ/4 plate provides the advantage that coupling of the alignment beam into the radiation path of the alignment system is performed with minimal radiation loss.

The beam $b_1$ passed by the alignment mark $M_2$ is reflected by a prism 11 and directed towards a radiation-sensitive detector 13 by, for example, a further reflecting prism 12. This detector is, for example, a composite photodiode having, for example, four separate radiation-sensitive areas in conformity with the number of sub-gratings according to FIG. 2. The output signals of these detectors are a measure of the coincidence of the mark $M_2$ with the image of the substrate mark $P_2$. These signals can be processed electronically and used for moving the mask with respect to the substrate by means of drive systems (not shown) in such a way that the image of the mark $P_2$ coincides with the mark $M_2$. An automatic alignment apparatus is thus obtained.

A beam splitter 14 in the form of, for example, a partially transparent prism which splits a part of the beam $b_1$ as beam $b_2$ may be arranged between the prism 11 and the detector 13. The split beam $b_2$ is then incident via, for example, two lenses 15 and 16 on a television camera 17 which is coupled to a monitor (not shown) on which the alignment marks $P_2$ and $M_2$ are visible to an operator of the illumination apparatus. This operator can then ascertain whether the two marks coincide and move the substrate W by means of manipulators so as to cause the marks to coincide.

Analogously as described hereinbefore for the marks $M_2$ and $P_2$, the marks $M_1$ and $P_2$ and the marks $M_1$ and $P_1$ can be aligned with respect to each other. The alignment system $AS_2$ is used for the two last-mentioned alignments.

Reference is made to U.S. Pat. No. 4,778,275 for details about the alignment procedure by means of the alignment systems.

The embodiments of the alignment device according to FIGS. 1 and 3 are particularly suitable for an apparatus in which an illumination beam having a short wavelength, for example, 248 nm and an alignment beam having a considerably longer wavelength, for example, 633 nm are used.

Since the projection lens system is designed for the wavelength of the projection beam PB, deviations occur when using this system PL for imaging the alignment marks $P_1$, $P_2$ and $M_1$, $M_2$ on each other by means of the alignment beams. The substrate alignment marks $P_1$, $P_2$ will not be imaged in the plane of the mask pattern in which the mask alignment marks are located but at a certain distance therefrom, which distance depends on the difference between the wavelengths of the projection beam and the alignment beams and the difference between the refractive indices of the material of the projection lens elements for the two wavelengths. If the projection beam has a wavelength of, for example 248 nm and the alignment beam has a wavelength of 633 nm, this distance may be up to 2 m. Moreover, due to said wavelength difference, the substrate alignment mark is imaged on a mask alignment mark with a magnification which deviates from the desired magnification, with the deviation increasing with an increasing wavelength difference.

To correct for said deviations, an extra lens, or correction lens 25 is incorporated in the projection column PL. The correction lens is arranged at such a height in the projection column that on the one hand the sub-beams of the different diffraction orders of the alignment beam, which sub-beams are formed by a substrate alignment mark, are sufficiently separated in the plane of the correction lens so as to be able to influence these sub-beams separately, and on the other hand this correction lens has a negligible influence on the projection beam and the mask image formed therewith. The correction lens is preferably arranged in the Fourier plane of the projection lens system. If the correction lens 25 is arranged in a plane in which the chief rays of the alignment beams $b_1$ and $b_1'$ intersect each other, as is shown in FIGS. 1 and 3, this lens can be used for correcting the two alignment beams.

In principle, the alignment device according to FIGS. 1 and 3 operates satisfactorily, but under certain circumstances small alignment errors may still occur. The Applicant has found that these alignment errors result from phase differences within the selected alignment beam portions captured by the detector 13 or 13', which phase differences occur if the symmetry axis of the alignment beam portions coming from a substrate alignment mark is not perpendicular to the mask plate so that false reflections may occur within this plate. To avoid this problem, the Applicant has already proposed to arrange a wedge or another deflection element in the proximity of a mask alignment mark.

Figure 4:
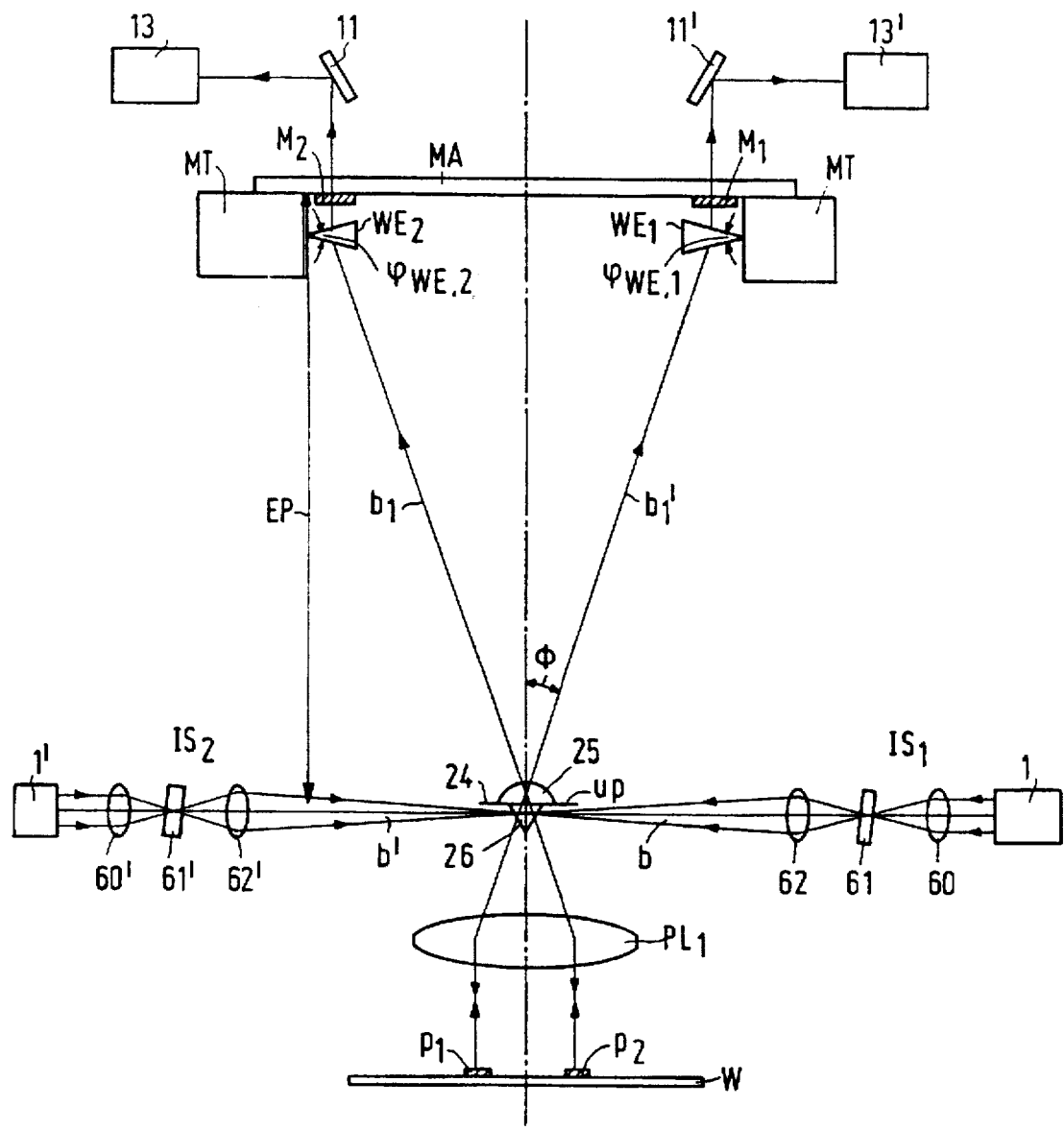
FIG. 4 shows a special embodiment of these alignment devices.

FIG. 4 shows an embodiment of the alignment device with two such wedges $WE_1$, $WE_2$ having wedge angles $\phi_{WE,2}$, $\phi_{WE,2}$. These wedges ensure that the symmetry axes of the alignment beams $b_1'$, $b_1$ are perpendicularly incident on the mask plate.

As is shown in the Figure, the substrate alignment marks $P_2$ and $P_1$ may be illuminated by separate illumination systems $IS_1$ and $IS_2$. Each illumination system comprises a radiation source 1 (1'), two lenses 60, 62 (60', 62') and an adjustable plane-parallel plate 61 (61') with which a fine adjustment of the direction of the beam b (b') can be realised. The lenses 60 and 62 ensure that the quality of the image of the source 1 (1') is maintained. Of the projection lens system only the lens group under the Fourier plane is diagrammatically shown in FIG. 4 by means of a single lens element $PL_1$.

The projection apparatus further comprises a focus error detection system for determining a deviation between the focal plane of the projection lens system PL and the surface of the substrate W so that this deviation can be corrected, for example, by moving the projection lens system along its axis. This system may be constituted by the elements 40, 41, 42, 43, 44, 45 and 46 which are arranged in a holder (not shown) which is fixedly connected to the projection lens system. The reference numeral 40 denotes a radiation source, for example a diode laser emitting a focusing beam $b_3$. This beam is directed at a very small angle onto the substrate by a reflecting prism 42. The beam reflected by the substrate is directed towards a retroreflector 44 by the prism 43. The element 44 reflects the beam in itself so that this beam ($b_3'$) once more traverses the same path via reflections on the prism 43, the substrate W and the prism 42. The beam $b_3'$ reaches a radiation-sensitive detection system 46 via a partially reflecting element 41 and a reflecting element 45. This detection system comprises, for example, a position-dependent detector or two separate detectors. The position of the radiation spot formed by the beam $b_3'$ on this system is dependent on the extent by which the focal plane of the projection lens system coincides with the plane of the substrate W. Reference is made to U.S. Pat. No. 4,356,392 for an extensive description of the focus error detection system.

For accurately determining the X and Y positions of the substrate table WT, known projection apparatuses comprise a multi-axis interferometer system. U.S. Pat. No. 4,251,160 describes a two-axis system and U.S. Pat. No. 4,737,283 describes a three-axis system. In FIG. 1 such an interferometer system is diagrammatically represented by the elements 50, 51, 52 and 53, the Figure showing only one measuring axis. A beam $b_4$ emitted by a radiation source 50 in the form of a laser is split into a measuring beam $b_{4,m}$ and a reference beam $b_{4,r}$ by a beam splitter 51. The measuring beam reaches a reflecting side face of the substrate holder WH and the reflected measuring beam is combined by the beam splitter with the reference beam reflected by a stationary retroreflector 52, for example, a so-called "corner cube". The intensity of the combined beam is measured with the aid of a detector 53 and the displacement, in this case in the X direction, of the substrate support WC can be derived from the output signal of this detector, and also an instantaneous position of this support can be established.

As is diagrammatically shown in FIG. 1, the interferometer signals represented by one signal $S_{53}$ for the sake of simplicity, and the signals $S_{13}$ and $S_{13}'$ of the alignment detection device are applied to a signal processing unit SPU, for example a microcomputer which processes said signals to control signals $S_{AC}$ for an actuator AC with which the substrate support is moved in the X-Y plane via the substrate holder WH.

By using an X-Y interferometer system, the positions of and the mutual distances between the alignment marks $P_1$ and $P_2$ and $M_1$ and $M_2$ can be established in a system of coordinates defined by the stationary interferometer system during the alignment procedure.

In accordance with a known method of repetitively imaging a mask pattern on a substrate, this substrate is prealigned to a certain extent, for example, in a prealignment station as described in European Patent Application no. 0,164,165. After the prealigned substrate has been introduced into the projection apparatus, the substrate is globally aligned with respect to the mask by means of the mask alignment marks $M_1$, $M_2$ and the substrate alignment marks $P_1$, $P_2$. Subsequently a substrate sub-area or field on which the mask pattern must be projected should be positioned under the mask pattern very accurately, whereafter a flash of light from the source LA transfers this pattern to the substrate field. Subsequently the substrate must be displaced and a second substrate field must be accurately positioned under the mask pattern whereafter a second illumination follows, and so forth until all substrate fields have been illuminated.

With the currently required very small details in mask pattern image in view of the small depth of focus of the projection lens system and the possible unevenness of the substrate causing defocused images, the relevant substrate sub-area must first be levelled before such an imaging operation can take place. To this end a so-called local level sensor must first detect whether the relevant substrate sub-area is oblique with respect to the image field of the projection lens system. Such a level sensor is described, for example, in the article "The optical stepper with a high numerical aperture i-line lens and a field-by-field levelling system" in SPIE vol. 922, Optical/Laser Microlithography (1988), pp. 270–276 and in U.S. Pat. No. 4,504,144. After a local oblique position has been found, it can be eliminated by tilting the entire substrate about the X and/or Y axis. However, the measuring mirrors of the interferometer systems are then also tilted so that the measuring signals supplied by this system are erroneous while the desired accurate positioning is no longer possible due to the so-called Abbe error.

Moreover, unintentional and uncontrolled tilts of the substrate holder about the X and/or Y axis may occur, which tilts also affect the signals of the interferometer system.

These difficulties could be avoided and after local levelling each substrate field could be positioned with the desired accuracy by providing each field with its own alignment mark and by aligning it separately with respect to a mask mark $M_1$ or $M_2$ after this field has been provided under the mask pattern, as described, inter alia in U.S. Pat. No. 4,778,275. This so-called field-by-field alignment is, however, time-consuming so that the number of substrates which can be put through the projection apparatus per unit of time is reduced.

Moreover, the strips between the substrate fields must then be relatively wide to accomodate the field alignment marks whose size must be adapted to that of the mask marks $M_1$ and $M_2$ and thus also to that of the substrate marks $P_1$ and $P_2$. As a result, the useful surface of the substrate, i.e. the total surface on which ICs can be formed, decreases. It could be considered to reduce the size of the field alignment marks. However, the mask alignment marks $M_1$ and $M_2$ and the substrate alignment marks must then also be reduced in size. As a result, the alignment accuracy would decrease, not only for the substrate fields but also for the total substrate.

The present invention obviates the above-mentioned problems and provides a novel method of repetitively imaging and the associated positioning. In accordance with the novel method the substrate is only globally aligned along the X and Y axes and the possible rotation about the Z axis of the substrate is globally eliminated by means of the two substrate alignment marks $P_1$ and $P_2$ and possibly several other substrate alignment marks, and after levelling a substrate field, the fine positioning of this field is realised without any further alignment steps. The field-by-field positioning is now effected by very accurately measuring preferably all movements and positions of the substrate itself by means of the interferometer system.

An essential condition and an important aspect of the present invention is that the substrate support is integrated with the mirror block cooperating with the interferometer system and that the substrate is fixed on this support. Then the substrate is immovable with respect to the mirror block and can only follow the movements of this block. This ensures that the measured movements and positions are absolute measures of those of the substrate. Thus novel use is made of the accuracy achieved nowadays with which the substrate holder can be driven and the movements of the mirror block can be measured.

It is to be noted that in drawings associated with descriptions of known projection apparatuses for IC manufacture the substrate and the substrate support seem to be connected directly and immovably to the mirror block. However, this is only a diagrammatic representation so as not to complicate the drawings of the intricate apparatus. As already noted, the substrate should not only be aligned in the projection apparatuses, but it should also be focused globally and locally and, as already noted, it should be levelled locally. Focusing is understood to mean that it is ensured that the substrate surface coincides with the image field of the projection lens system. Separate actuators such as height and/or tilt actuators are used for these focusing and levelling operations, as described in SPIE vol. 922 "Optical/Laser Microlithography" (1988) pp. 270–276: 'The optical stepper with a high numerical aperture I-lens and a field-by-field levelling system" or in SPIE, vol. 811, "Optical Microlithographic Technology for Integrated Circuit Fabrication and Inspection", 1987, pp. 149–159, "An advanced waferstepper for sub-micron fabrication", or in U.S. Pat. No. 4,504,144. The height or levelling actuators referred to in these documents drive a so-called levelling table on which the substrate is arranged. Then this substrate cannot be connected rigidly to the mirror block. In a projection apparatus intended for performing the method according to the invention said actuators are arranged under the mirror block.

Figure 5:
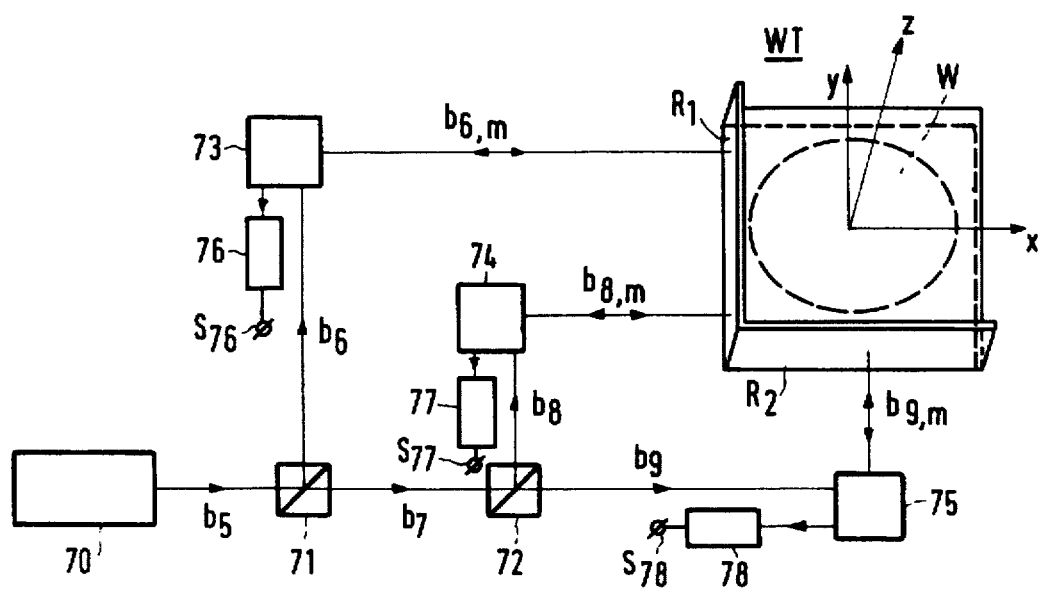
FIG. 5 shows a known three-axis interferometer system.

In principle, a three-axis interferometer system can be used for measuring the movements along the X and Y axes and for determining the final positions of this table, and for determining the rotation of the table about the Z axis. Such a system, an embodiment of which is described in "SPIE, vol. 1088: Optical/Laser Microlithography, pp. 268–272, Linear/angular displacement interferometer for waferstage metrology", is diagrammatically shown in FIG. 5, together with the substrate table WT.

The composite interferometer system comprises a Helium-Neon laser 70, two beam splitters 71 and 72 and three interferometer units 73, 74 and 75. A part of the beam $b_5$ from the laser is reflected by the beam splitter 71 as beam $b_6$ to the interferometer unit 73 which cooperates with the mirror $R_1$ of the substrate table WT. The beam $b_7$ passed by the beam splitter 71 is split by the beam splitter 72 into a beam $b_8$ which is reflected to the interferometer unit 74 and into a beam $b_9$ which is passed to the interferometer unit 75. The interferometer unit 74 cooperates with the mirror $R_1$, while the interferometer unit 75 cooperates with the mirror $R_2$.

Figure 6:
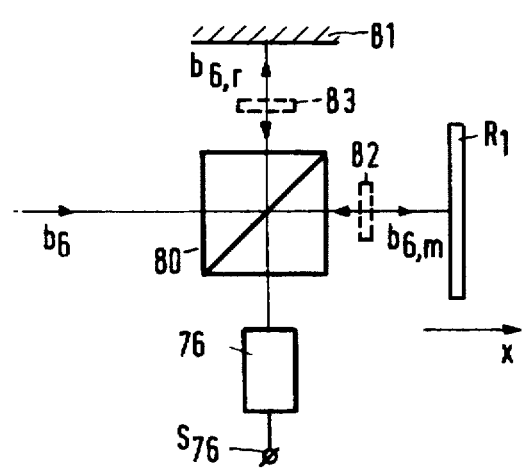
FIG. 6 shows the principle of a one-axis interferometer system.

FIG. 6 shows the principle of the interferometer unit 73. This unit comprises a beam splitter 80, for example, a partially transparent mirror which splits the incoming beam $b_6$ into a measuring beam $b_{6,m}$ and a reference beam $b_{6,r}$. The measuring beam is passed to the substrate table mirror $R_1$ which reflects this beam to the beam splitter 80 which in its turn reflects a part of the beam $b_{6,m}$ to the detector 76. The beam $b_{6,r}$ reflected by the beam splitter 80 is reflected to the beam splitter 80 by a fixedly arranged reference mirror 81 which passes a part of this beam to the detector 76. When the substrate table mirror is moved in the X direction, constructive and destructive interferences alternately occur between the beams $b_{6,m}$ and $b_{6,r}$ incident on the detector 76, so that the output signal of this detector passes from a maximum value to a minimum value, and conversely, whenever the substrate table is displaced over a distance of $\lambda/4$, in which $\lambda$ is the wavelength of the beam $b_b$. The number of maxima and minima of the detector signal $S_{76}$ is a measure of the displacement of the table in the X direction. Movements of the mirrors $R_1$ and $R_2$ which are much smaller than $\lambda/4$, for example, up to $\lambda/128$ or even $\lambda/512$ can be measured with the aid of known electronic interpolation methods.

The interferometer units 74 and 75 have the same construction and operate in the same way as the interferometer unit 73. The movement of the substrate table in the Y direction is measured by means of the interferometer unit 75 and the associated detector 78. A second X displacement measurement is performed with the interferometer unit 74 and the associated detector 77. The rotation of the substrate table about the Z axis is computed from the signals $S_{76}$ and $S_{77}$. This rotation is given by $$\phi_z = \frac{S_{76} - S_{77}}{d_i}$$

in which $d_i$ is the distance between the points where the chief rays of the measuring beams $b_{6,m}$ and $b_{8,m}$ impinge upon the mirror $R_1$.

It is to be noted that FIG. 6 only shows the principle of an interferometer unit. In practice a polarization-sensitive beam splitter 80 and a number of $\lambda/4$ plates, represented by the elements 82 and 83 in FIG. 6, will be used for beam splitting and combination. Then the radiation loss is minimal, which is particularly important if only one laser 70 is to be used for the different interferometer units. Furthermore, retroreflectors as described in said article in SPIE, vol. 1088, Optical/Laser Microlithography II, pp. 268–272 may be incorporated in the interferometer units.

To achieve the desired accuracy when using a three-axis interferometer system, the following two conditions should be fulfilled:

1. The chief rays of the interferometer beams must be located in the plane of the substrate.
2. The substrate support must during the displacements along the X and Y axes and the possible correction about the Z axis be fixed in the other degrees of freedom $\phi_x$, $\phi_y$.

Due to the non-infinitely small cross-section of the interferometer beams and due to the fact that the edges of the mirrors, notably the upper edge, cannot be given the desired planeness (of, for example $\lambda/20$) so that the beams must be incident at a distance of, for example, at least 2 mm from the upper edge, the first condition can only be fulfilled if the mirrors project beyond the surface of the substrate, as is shown in SPIE, vol. 1088, Optical/Laser Microlithography II, 1989, pp. 424–433: "Step and Scan: A systems overview of a new lithography tool". Due to the higher mirrors the weight of the mass to be displaced and positioned increases. Moreover, these mirrors require extra free space between the substrate surface and the lower side of the projection lens system. However, this space is often unavailable in practice because the interspace between the substrate surface and the projection lens system must be as small as possible so as to obtain a maximally plane image field at the area of the substrate surface. Moreover, this intermediate space should accommodate optical measuring systems for level sensing and image sensing, i.e. detecting deviations in the image formed by the projection light.

It could be considered to enlarge the lateral dimensions of the block of which the interferometer mirrors form part, so that the mirrors projecting beyond the substrate surface remain sufficiently far remote from the other components of the projection apparatus, for example the projection lens system, also in the case of a lateral X-Y movement of the mirror block. However, this would involve an inadmissible increase of weight of the substrate holder and, moreover, the considerably larger mirrors cannot be manufactured with the desired planeness.

Figure 7:
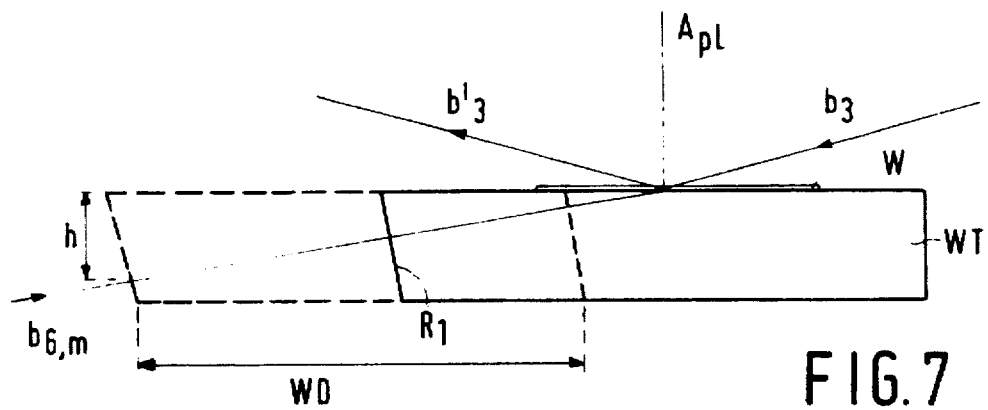
FIG. 7 shows an integrated substrate support and mirror block unit with obliquely arranged mirrors.

Instead of a mirror block with mirrors projecting beyond the substrate surface, a mirror block may alternatively be used whose mirrors do not project beyond the substrate but extend at an angle of less than 90° to the substrate surface so that the interferometer beams are always perpendicularly incident on the mirror surfaces. Such a mirror block is shown in FIG. 7, together with an interferometer beam $b_{6,m}$. If it is ensured that the extension of the principal axis of this beam impinges upon the substrate surface at the point where the optical axis $A_{PL}$ of the projection lens system intersects this surface, the exact position of the substrate can be derived from the interferometer signals and the signals supplied by the focus error detection system which is shown in FIG. 1 and is shown also in FIG. 7 but only by means of the beams $b_3$ and $b_3'$. However, to ensure that the interferometer beam always impinges upon the mirror when the mirror block with the substrate table is moved over the working distance WD, this mirror must have a considerable height h, which means that the weight of the mirror block increases.

To fulfil the above-mentioned condition, i.e. the substrate support should not exhibit a tilt about the X or Y axis and no dislacement along the Z axis, very stringent requirements must be imposed on the construction of the substrate table. Apart from the substrate support with the integrated mirror block this table comprises an X-Y-$\phi_z$ drive consisting of, for example, three linear motors arranged in a H configuration as described in U.S. Pat. No. 4,655,594, and a so-called air base AB as an intermediary between a base plate BP of, for example, granite and a substrate holder WH incorporating the X-Y-$\phi_z$ drive. When the substrate table is not perfectly guided, variable forces may be exercised on the air base when this table is moved. These forces, which are unpredictable in advance, result in a variable tilt of the air base, which results in a variable tilt of the substrate support. Furthermore, deviations in the planeness of the granite supporting plate may occur due to manufacturing tolerances or contamination. An unevenness of the plate will result in a position-dependent tilt of the substrate support. To eliminate its effect during use of the projection apparatus, a point-by-point calibration should have to be performed, which does not only complicate the total calibration of the apparatus but also renders it more inaccurate because the number of parameters to be calibrated increases.

The stringent construction requirements could also be dropped and the then arising unwanted tilts about the X and Y axes and the tilts due to local levelling could then be measured by means of, for example, mechanical, ultrasonic or other non-optical sensors and the measuring results could be used to level out said variations or to correct the X-Y-$\phi_z$ measuring results. However, very stringent requirements must then be imposed on the accuracy of such sensors.

In the projection apparatus according to the present invention the problems, which occur when maintaining the requirement that the chief rays of the interferometer beams must be located in the plane of the substrate, are avoided by dropping this requirement and by making use of a substrate support having an integrated mirror block whose mirrors do not project beyond the substrate surface. Another problem then arising, as well as the problems resulting from the requirement that either no tilts about the X and Y axes occur or that these tilts should be taken into account in the X-Y-$\phi_z$ adjustment, are solved by using a novel and extended interferometer system with which the wanted or unwanted movements can be accurately measured and which provides the possibility of accurate correction.

Figure 8:
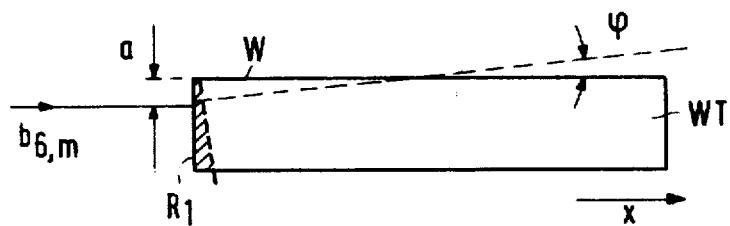
FIG. 8 shows the Abbe error which may occur in known apparatuses.

Said other problem relates to the so-called Abbe error which is illustrated in FIG. 8. If the principal axis of an interferometer beam, for example, $b_{6,m}$ is incident on the mirror $R_1$ at a distance a from the substrate surface, a tilt of the substrate surface at an angle $\phi$ generates a cross-talk signal in the X position signal supplied by the interferometer unit using beam $b_{6,m}$. This crosstalk signal $\Delta x$ is given by $\Delta x \approx a \tan\phi \approx a\phi$. As a result of the crosstalk signal the X servosystem will control in such a way that an X position error proportional to $\Delta x$ is produced. For the tilt of the substrate surface the angle $\phi$ may be 1.3 m.rad and for a local field unevenness $\phi$ may be approximately 0.1 m.rad. If in the latter case the position error due to the Abbe arm is to be smaller than 4 nm, which is still admissible in practice, then $$a = \frac{\Delta x}{\phi} < \frac{5 \text{ nm}}{0,1 \text{ mrad}} \approx 50 \text{ }\mu\text{m}$$

This requirement cannot be met due to the width of the beam which is, for example, 9 mm. It will therefore be necessary to calibrate, i.e. the X and Y position signals will have to be corrected with information about the tilt of the substrate surface. This tilt information may be obtained more easily and more accurately with the extensive interferometer system than with other means, for example, via mechanical or other non-optical sensors.

Figure 10:
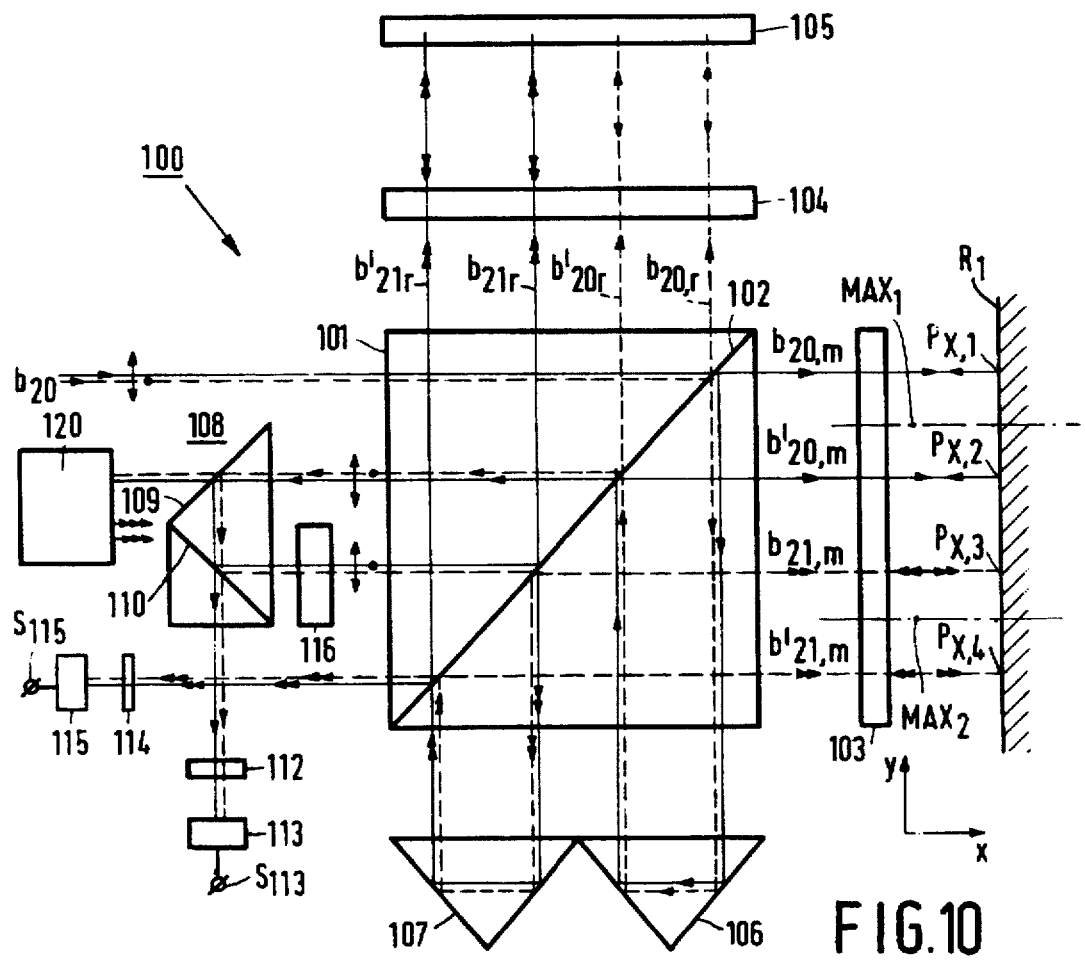
Figure 9:
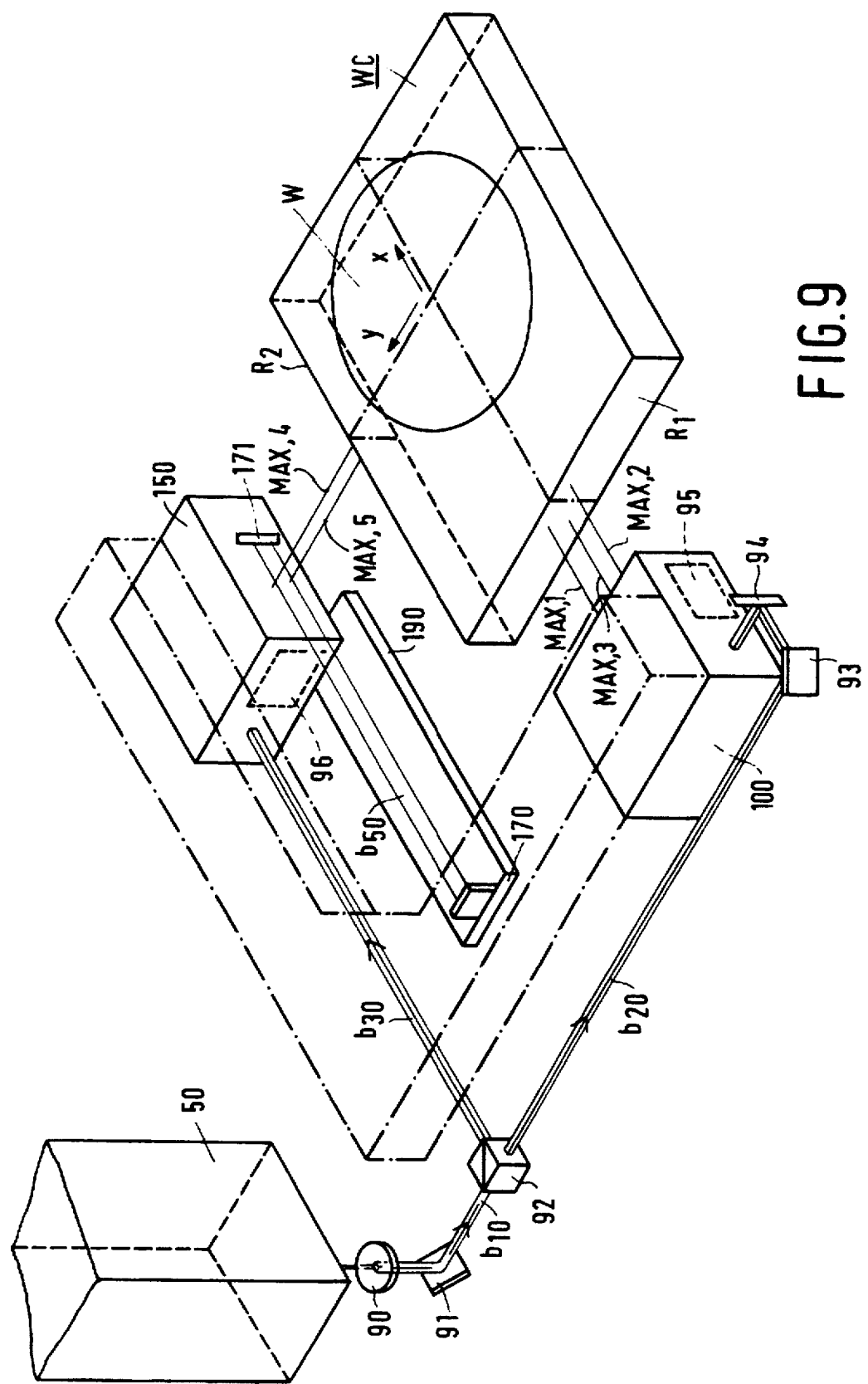
FIG. 9 is a perspective view of a six-axis interferometer system according to the invention.

FIG. 9 shows the principle of the composite interferometer system for measuring the five degrees of freedom X, Y, $\phi_x$, $\phi_y$ and $\phi_z$ of the substrate support WT with an integrated mirror block. The system comprises, for example, two interferometer units 100 and 150 to which the beams $b_{20}$ and $b_{30}$ are supplied. These beams are emitted by a laser, for example a Helium-Neon laser 50. The beam $b_{10}$ coming from this laser first passes a beam-widening optical system diagrammatically shown by means of the lens 90 and is subsequently split into the two beams $b_{20}$ and $b_{30}$ by a beam splitter 92. The elements 91, 93 and 94 are mirrors which ensure that the beams are deflected in such a way that they are incident on the interferometer units 100 and 150 at the correct angles. The interferometer unit 100 may be implemented in such a way that it emits three measuring beams towards the mirror $R_1$ and receives these beams from this mirror. With these beams the displacement in the X direction, the tilt about the Y axis, $\phi_Y$, and the rotation about the Z axis, $\phi_Z$, of the mirror block and substrate support can be measured. The second interferometer unit 120 sends two measuring beams to and receives two measuring beams from the mirror $R_2$. With these beams the displacement in the Y direction and the tilt about the X axis can be measured. The interferometer units may be implemented in various ways. FIG. 10 shows a first embodiment of the interferometer unit 100. It comprises a polarization-sensitive beam splitter 101, two $\lambda/4$ plates 103, 104, a reference mirror 105, two retroreflectors 106, 107, a composite prism 108 and two detectors 113, 115. The detectors may be arranged on the plane 95 of the interferometer unit 100 shown in FIG. 9. The interferometer unit is of the heterodyne type. The beam $b_{20}$ then comes from a Helium-Neon laser which is implemented as a Zeeman laser. Such a laser supplies a beam with two mutually perpendicularly polarized components which have an optical phase difference of, for example 20 MHz. These two components are shown in FIG. 10 by means of solid lines and broken lines.

The beam $b_{20}$ entering the prism 101 is split into a measuring beam $b_{20,m}$ and a reference beam $b_{20,r}$ by the polarization-sensitive interface 102. The beam $b_{20,m}$ is passed to the mirror $R_1$ of the substrate table and is reflected by this mirror. A $\lambda/4$ plate 103 ensuring that the direction of polarization of the reflected beam, which has traversed the $\lambda/4$ plate twice, is rotated through 90° with respect to the direction of polarization of the ongoing beam $b_{20,m}$ is arranged between the prism 101 and the mirror $R_1$. The reflected beam is then reflected by the interface 102 to a retroreflector 106, for example, in the form of a three-dimensional corner cube prism. The beam reflected by the prism is subsequently reflected by the interface 102 and sent as measuring beam $b'_{20,m}$ to the mirror $R_1$ again and reflected by this mirror to the prism again. This beam has then again traversed the $\lambda/4$ plate twice so that it is now passed by the interface 102. The beam $b'_{20,m}$ subsequently reaches a prism system 108 and is reflected by its surface 109 to a radiation-sensitive detector 113 via an analyser 112.

The reference beam $b_{20,r}$ reflected by the interface 102 traverses the $\lambda/4$ plate 104, is reflected by the reference mirror 105 and traverses the $\lambda/4$ plate a second time. The direction of polarization of the beam incident on the interface 102 is rotated through 90° so that it is passed on to the retroreflector 106. The beam $b'_{20,r}$ reflected by this element is again sent as a reference beam to the reference mirror 105 and reflected by this mirror to the interface 102, the direction of polarization being rotated through 90° again. The interface 102 subsequently reflects the beam to the prism system 108 whose face 109 sends the beam $b'_{20,r}$ to the detector 113. The direction of polarization of the analyser 112 extends at an angle of 45° to the two mutually perpendicular directions of polarization of the beams $b'_{20,m}$ and $b'_{20,r}$. The components of the beams $b'_{20,m}$ and $b'_{20,r}$ passed by the analyser have the same direction of polarization and interfere with each other. The output signal $S_{113}$ of the detector 113 has an intensity modulation at a frequency which is equal to the Zeeman frequency difference plus or minus a frequency shift which is dependent on the displacement of the substrate table mirror $R_1$ in the X direction.

In principle the retroreflector 106 could also be omitted so that the measuring beam and the reference beam incident on the detector 113 would only be reflected once by the substrate table mirror $R_1$ and the reference mirror 105, respectively.

The special embodiment of the interferometer according to FIG. 10, in which use is made of the retroreflector 106 to reflect the measuring beam twice as beams $b_{20,m}$ and $b'_{20,m}$ on the substrate support mirror, has the great advantage that the direction of the measuring beam $b'_{20,m}$ ultimately incident on the detector 113 is independent of a tilt of the mirror $R_1$ about an axis perpendicular to the X axis. As a result the signal $S_{113}$ contains only true X displacement information. For the same reason, a possible tilt of the reference mirror 105 does not have any influence on the signal $S_{113}$.

The rotation of the substrate support about the Z axis, which is perpendicular to the plane of the drawing in FIG. 10, can also be measured by means of the interferometer unit of FIG. 10. This is effected via a second X measurement at a position $P_{x,3}$ ($P_{x,4}$) at a maximum possible distance from the position $P_{x,1}$ ($P_{x,2}$) where the first X measurement is performed. To this end the face 110 of the prism system 108 is in the form of a partially transparent mirror which reflects a portion of the measuring beam $b'_{20,m}$ and the reference beam $b'_{20,r}$ as a new reference beam $b_{21,r}$ and a new measuring beam $b_{21,m}$, respectively, to the beam splitter 101. The direction of polarization of the two beams is first rotated through 90° by means of the λ/2 plate 116 so that the functions of these beams are interchanged. The measuring beam $b_{21,m}$ is passed to the substrate support mirror by the polarization-sensitive interface 102, while the reference beam $b_{21,r}$ is reflected to the reference mirror. The paths traversed by the beams $b_{21,m}$ and $b_{21,r}$ are analogous to those traversed by the beams $b_{20,m}$ and $b_{20,r}$. Preferably, a second retroreflector 107 is provided which ensures that the measuring beam and the reference beam are sent a second time to the substrate table mirror $R_1$ and the reference mirror as beams $b'_{21,m}$ and $b'_{21,r}$. Via the beam splitter 101, the prism system 108 and a second analyser 114 the reflected beams $b'_{21,m}$ and $b'_{21,r}$ reach a second detector 115 where they interfere with each other.

The output signal $S_{115}$ of this detector has an intensity modulation at a frequency which is equal to the Zeeman difference frequency plus or minus a frequency shift which, however, is now dependent on the possible rotation of the mirror $R_1$ about the Z axis. In fact, if such a rotation occurs, the frequency shift between the measuring and reference beams at their first passage through the system, at which reflections occur at the positions $P_{x,1}$ and $P_{x,2}$ is different from the frequency shift at the second passage through the system, at which reflections occur at the positions $P_{x,3}$ and $P_{x,4}$. The frequency difference measured by means of the detector 115 is the difference between said frequency shifts. If the substrate support mirror does not have a rotation about the Z axis, the resultant frequency difference is equal to zero.

For the way in which the signals $S_{113}$ and $S_{115}$ can be electronically processed so as to derive the X displacement and the rotation $\phi_Z$ about the Z axis of the substrate table from the frequency shifts, reference may be made by way of example to the article in SPIE, vol.1088 "Optical/Laser Microlithography" II, 1989, pp. 268–272.

Instead of a beam $b_{20}$ with two frequency components, a beam having only one frequency may be used. The displacement or rotation of the mirror $R_1$ is then measured by determining the phase difference between the measuring and reference beams.

According to the present invention the known interferometer unit described so far can be extended so that a third measurement, for example, of the tilt about the Y axis can be performed with this unit. To this end, for example, the face 109 of the prism system 108 may be implemented as a partially transparent mirror which passes a portion of the beams $b'_{20,m}$ and $b'_{20,r}$ as is shown in FIG. 10. A reflector system 120 is arranged in the path of the beam portions which have been passed. This system must reflect the beams to the beam splitter 101 and displace these beams parallel to themselves in the Z direction so that the beams will extend in a second XY plane which is located in front of or behind the plane of the drawing in FIG. 10. This plane is shown in FIG. 11 together with the third measuring beam $b_{22,m}$ and reference beam $b_{22,r}$.

The path of the beams $b_{22,m}$ and $b_{22,r}$ in front of the beam splitter 101 incorporates a λ/2 plate 125 which rotates the direction of polarization of these beams through 90° so that the functions of the reference beam and the measuring beams are interchanged. Preferably, there is a third retroreflector 128 so that the measuring beam is reflected twice as beams $b_{22,m}$ and $b'_{22,m}$ at the positions $P_{x,5}$ and $P_{x,6}$, respectively, by the substrate support mirror $R_1$ and the reference beam is reflected twice as beams $b_{22,r}$ and $b'_{22,r}$ by the reference mirror. The paths traversed by the measuring beams and reference beams are analogous to those traversed by the measuring beams $b_{20,m}$ and $b'_{20,m}$ and the reference beams $b_{20,r}$ and $b'_{20,r}$ in FIG. 10.

The beams $b'_{22,m}$ and $b'_{22,r}$ ultimately reach a polarization analyser 126 which passes the components having the same direction of polarization of these beams, which components interfere with each other, to a detector 127. The output signal $S_{127}$ of this detector has an intensity modulation at a frequency which is equal to the Zeeman difference frequency plus or minus a frequency shift which is dependent on the possible tilt of the mirror $R_1$ about the Y axis. In fact, if such a tilt occurs, the frequency shift between the measuring beam $b'_{20,m}$ and the reference beam $b'_{20,r}$ differs from the frequency shift between the measuring beam $b'_{22,m}$ and the reference beam $b'_{22,r}$. The frequency difference measured by means of the detector 127 is the difference between these frequency shifts. If the substrate table does not have a tilt about the Y axis, the resultant frequency difference is equal to zero. This tilt can also be measured by means of a single frequency beam and by determining phase differences.

FIG. 12 shows an embodiment of the reflector system 120 in detail. This system comprises a first reflector 121 which reflects the beams $b'_{20,m}$ and $b'_{20,r}$ extending parallel to the X axis towards the Z axis, and a second reflector 122 which reflects these beams again in a direction parallel to the X axis. The reflector pair 121, 122 thus displaces the beams parallel to themselves along the Z axis.

Figure 13:
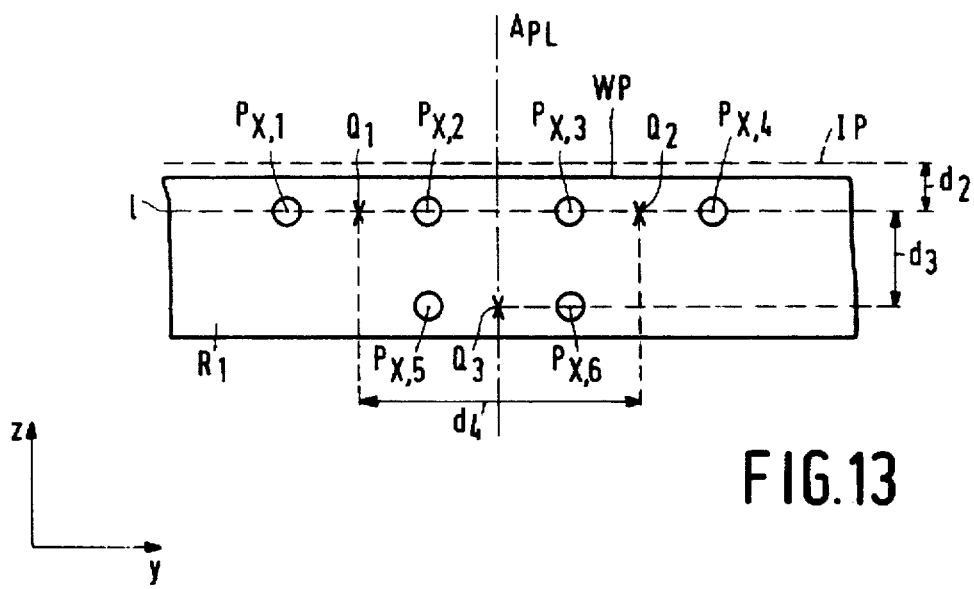
FIG. 13 shows the positions where the measuring beams impinge on a substrate support mirror and where the measuring axes intersect this mirror.

In the embodiment of FIGS. 11 and 12, in which the beams $b_{22,m}$ and $b'_{22,m}$ are displaced in the Z direction only, the points $P_{x,5}$ and $P_{x,6}$ where the chief rays of these measuring beams impinge upon the substrate table mirror $R_1$ have the same X positions as the points $P_{x,2}$ and $P_{x,3}$ where the chief rays of the measuring beams $b'_{20,m}$ and $b'_{21,m}$ impinge upon this mirror. This is shown in FIG. 13 for the sake of clarity. In this Figure the points where the chief rays of the measuring beams $b_{20,m}$, $b'_{20,m}$, $b_{21,m}$, $b'_{21,m}$, $b_{22,m}$ and $b'_{22,m}$ are incident on the mirror $R_1$ are denoted by the circles $P_{x,1}$, $P_{x,2}$, $P_{x,3}$, $P_{x,4}$, $P_{x,5}$ and $P_{x,6}$, respectively. A so-called measuring axis is associated with each pair of measuring beams. These measuring axes are denoted by $MAX_1$, $MAX_2$ and $MAX_3$ in FIGS. 10 and 11. The points where these measuring axes intersect the mirror $R_1$ are denoted by $Q_1$, $Q_2$ and $Q_3$, respectively, in FIG. 13.

The point $Q_3$ is preferably located in a plane through the optical axis $A_{PL}$ of the projection lens system and perpendicular to the plane of the drawing in FIG. 13, hence perpendicular to the mirror $R_1$. The points $Q_1$ and $Q_2$ are preferably located symmetrically with respect to this plane so that the connection line 1 between the points $Q_1$ and $Q_2$ is parallel to the image plane IP of the projection lens system, which image plane coincides with the substrate surface WP if this surface is an ideal surface.

The measuring beams and the measuring axes are further preferably parallel so as to prevent interference patterns instead of a single radiation spot to occur at the location of the detectors 113, 115 and 127. This parallelism, which is determined by the planeness of the surfaces of the beam splitter 101, of the prism system 108 and of the reflector system 120, and by the angle between the surfaces 109 and 110 of the prism system 108 and the angle between the surfaces 121 and 122 of the reflector system, can be satisfactorily realised in practice because said surfaces can be accurately flattened within 3 angle seconds and because said angles can be made accurately equal to 90°. The reflector system 120 is preferably integrated with the prism system 108 so as to avoid alignment problems during assembly and to ensure stability with time.

The distance $d_2$ between the image plane IP and the line of connection 1 must be as short as possible. The distance $d_3$ between the line 1 and the point $Q_3$ and the distance $d_4$ between the points $Q_1$ and $Q_2$ should be as long as possible so as to be able to measure the tilt $\phi_y$ and the rotation $\phi_z$ as accurately as possible. On the other hand, these distances should remain limited so as to limit the dimensions and hence the weight of the mirror $R_1$. In a realised embodiment of the device the distances $d_3$ and $d_4$ are of the order of 20 mm, while the distance $d_2$ is of the order of 7 mm.

The interferometer unit shown in FIGS. 10 and 11 has the advantage that the measuring beam and reference beam associated with a measuring axis are symmetrical with respect to the beam splitter 101 and have the same path lengths through this beam splitter. This substantially eliminates the risk of instabilities. In the device according to FIGS. 10 and 11 the differences between the signals associated with the measuring axes $MAX_1$, $MAX_2$ and $MAX_3$, which differences are required for measuring the rotation $\phi_z$ and the tilt $\phi_y$ are determined optically. If the information obtained via the measuring axes is represented by $I_{MAX,1}$, $I_{MAX,2}$ and $I_{MAX,3}$, the detector signals $S_{113}$, $S_{115}$ and $S_{127}$ in the embodiment of FIGS. 10 and 11 are given by $S_{113} = I_{MAX,1}$
$S_{115} = I_{MAX,1} - I_{MAX,2}$
$S_{127} = I_{MAX,1} - I_{MAX,3}$ The measuring axis information as a function of the detector signals is:

$I_{MAX,1} = S_{113}$
$I_{MAX,2} = S_{113} - S_{115}$
$I_{MAX,3} = S_{113} - S_{127}$

The signals $S(X)$, $S(\phi_z)$ and $S(\phi_y)$ which comprise information about the magnitude and direction of the displacement along the X axis, the rotation about the Z axis and the tilt about the Y axis then are:

$$S(X) = \frac{I_{MAX,1} + I_{MAX,2} + I_{MAX,3}}{3}$$

$$S(\phi_z) = \frac{I_{MAX,1} - I_{MAX,2}}{d_4}$$

$$S(\phi_y) = \frac{I_{MAX,1} - I_{MAX,3}}{d_3}$$

or:

Taking calibration parameters in connection with the Abbe arm into account, the X position, the rotation about the Z axis and the tilt about the Y $$S(X) = \frac{S_{113} + (S_{113} - S_{115}) + (S_{113} - S_{127})}{3} = S_{113} - \frac{S_{115} + S_{127}}{3}$$

$$S(\phi_z) = \frac{S_{113} - (S_{113} - S_{115})}{d_4} = \frac{S_{115}}{d_4}$$

$$S(\phi_y) = \frac{S_{113} - (S_{113} - S_{127})}{d_3} = \frac{S_{127}}{d_3}$$

axis of the substrate can be determined by means of these signals.

Alternatively, the difference between the signals associated with the different measuring axes may be determined electronically instead of optically. Then three separate beams should be supplied to the beam splitter 101, as is shown in FIG. 14.

Figure 14:
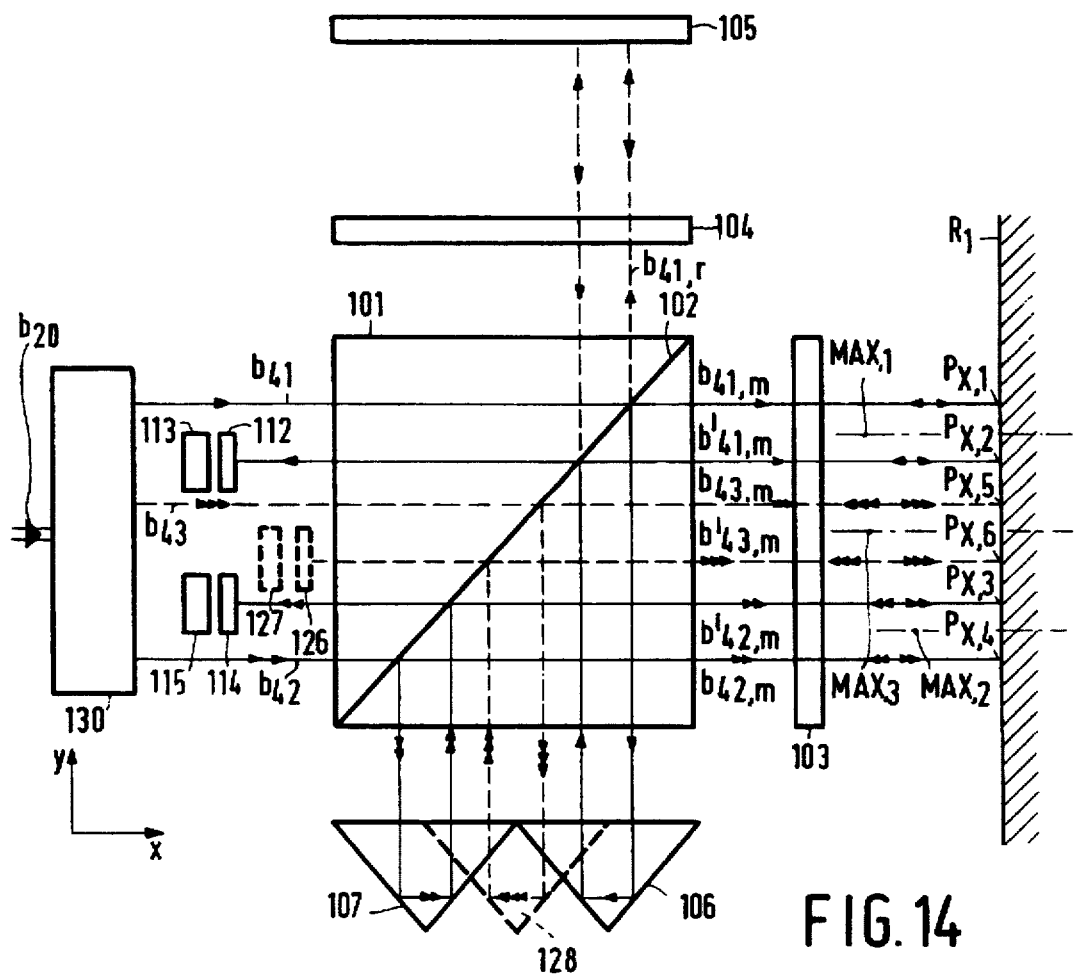
FIG. 14 shows a second embodiment of a three-axis interferometer unit.

The path of the beam $b_{20}$ incorporates, in front of the polarization-sensitive beam splitter 101, a polarization-insensitive beam splitter 130 which splits the beam $b_{20}$ into a first and a second beam $b_{41}$ and $b_{42}$ whose principal axes are located in a first X-Y plane, the plane of the drawing in FIG. 14, and a third beam $b_{43}$ whose principal axis is located in a second X-Y plane in front of or behind the plane of the drawing in FIG. 14. The beam splitter 130 comprises a combination of partially or not partially transparent reflectors and may be implemented in various ways. For example, the reflectors may be faces of plane-parallel plates, so that the beams $b_{41}$, $b_{42}$, and $b_{43}$ are satisfactorily parallel. Each of these beams is split by the interface 102 into a measuring beam and a reference beam $b_{43,m}$ and $b_{43,r}$, $b_{42,m}$ and $b_{42,r}$ and $b_{41,m}$ and $b_{41,r}$, respectively. For the sake of clarity only a part of the radiation path is shown for the reference beam $b_{42,r}$.

Preferably retroreflectors 106, 107 and 128 are arranged in the paths of the beams $b_{41}$, $b_{42}$ and $b_{43}$ so that the measuring beams $b'_{41,m}$, $b'_{42,m}$ and $b'_{43,m}$ leaving the beam splitter are reflected twice by the substrate support mirror $R_1$. Each measuring beam, together with the associated reference beam, is incident on a separate detector 113, 115 or 127 via an analyser 112, 114 and 126. For the sake of clarity in FIG. 14 the Y positions of the points $P_{x,5}$ and $P_{x,6}$ where the chief rays of the measuring beams $b_{43,m}$ and $b'_{43,m}$ impinge upon the mirror $R_1$, are different from those of the points $P_{x,2}$ and $P_{x,3}$ where the beams $b'_{41,m}$ and $b_{42,m}$ impinge upon the mirror. However, the Y position of $P_{x,5}$ and $P_{x,6}$ preferably coincides with that of $P_{x,2}$ and $P_{x,3}$ respectively so that the situation of FIG. 13 is obtained again.

For the embodiment of FIG. 14 the relationship between the detector signals $S_{113}$, $S_{115}$ and $S_{127}$ and the information obtained via the measuring axes is as follows:

$S_{113} = I_{MAX,1}$
$S_{115} = I_{MAX,2}$
$S_{127} = I_{MAX,3}$.

The measuring signals $S(X)$, $S(\phi_z)$ and $S(\phi_y)$ may now be:

$$S(X) = \frac{I_{MAX,1} + I_{MAX,2} + I_{MAX,3}}{3}$$

$$S(\phi_z) = \frac{I_{MAX,1} - I_{MAX,2}}{d_4}$$

$$S(\phi_y) = \frac{\frac{I_{MAX,1} + I_{MAX,2}}{2} - I_{max,3}}{d_3}$$

and, in terms of detector signals:

$$S(X) = \frac{S_{113} + S_{115} + S_{127}}{3}$$

$$S(\phi_z) = \frac{S_{113} - S_{115}}{d_4}$$

$$S(\phi_y) = \frac{S_{113} - S_{115}}{2} - S_{127}$$

The choice between a device with three independent measuring axes and a device with three coupled measuring axes is determined by the extent to which an interferometer error $\Delta$ may affect the measuring signals $S(X)$, $S(\phi_z)$ and $S(\phi_y)$. The interferometer error $\Delta$ is the error caused by the interferometer itself in the detector signals $S_{113}$, $S_{115}$ and $S_{127}$. When such an error $\Delta$ occurs in each detector signal, the error in the measuring signals, in the case of three independent measuring axes is:

$$\Delta S(X) = \frac{\Delta + \Delta + \Delta}{3} = \Delta$$

$$\Delta S(\phi_z) = \frac{\Delta + \Delta}{d_4} = \frac{2\Delta}{d_4}$$

$$\Delta S(\phi_y) = \frac{\frac{\Delta + \Delta}{2} + \Delta}{d_3} = \frac{3\Delta}{2d_3}$$

and in the case of three coupled measuring axes:

$$\Delta S(X) = \Delta + \frac{\Delta + \Delta}{3} = \frac{5}{3}\Delta$$

$$\Delta S(\phi_z) = \frac{\Delta}{d_4}$$

$$\Delta S(\phi_y) = \frac{\Delta}{d_3}$$

Figure 15:
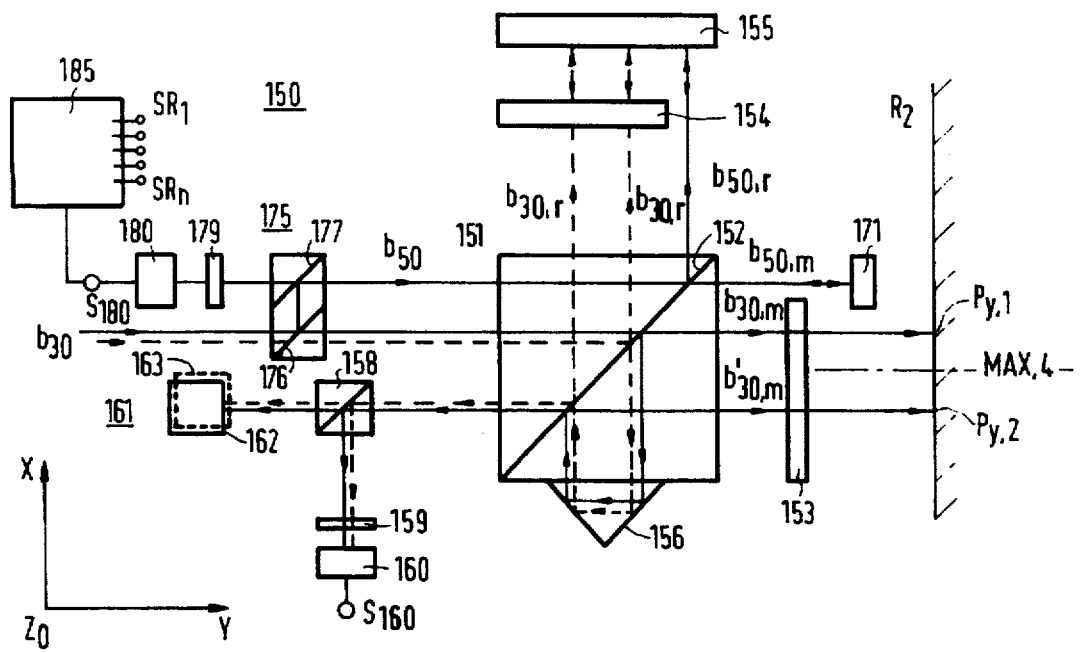
FIGS. 15 and 16 show an embodiment of a two-axis interferometer unit in accordance with two cross-sections in different XY planes.
Figure 16:
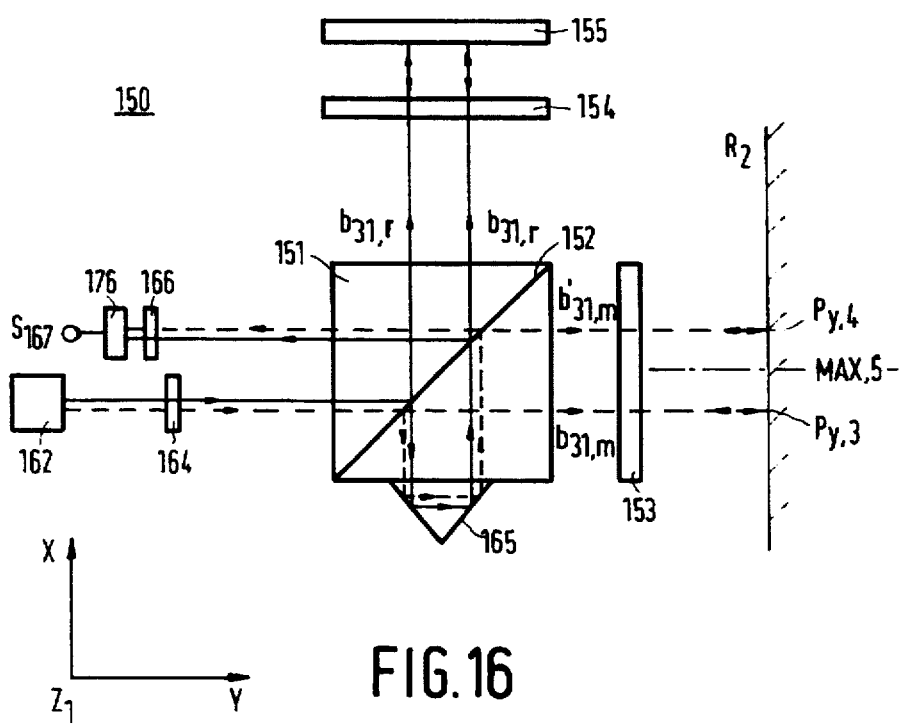

In order to determine the displacement of the substrate table in the Y direction and the tilt about the X axis, the composite interferometer system according to the invention includes a second interferometer unit which is denoted by 150 in FIG. 9. In principle, this interferometer has two measuring axes $MAX_4$ and $MAX_5$ and its structure is analogous to that of the interferometer unit 100. FIGS. 15 and 16 show the interferometer unit 150 in detail.

The incoming beam $b_{30}$, with two mutually perpendicularly polarized components having a given frequency difference, is split by the interface 152 of a beam splitter 151 into a measuring beam $b_{30,m}$ and a reference beam $b_{30,r}$. The measuring beam is reflected by the second substrate support mirror $R_2$ and is reflected twice at the positions $P_{y,1}$ and $P_{y,2}$ in the presence of a retroreflector 156. The measuring beam $b'_{30,m}$ from the beam splitter 151 is combined with the reference beam $b'_{30,r}$ which is reflected twice by the reference mirror 155. The two $\lambda/4$ plates 153 and 154 ensure that the measuring and reference beams acquire the direction of polarization which is desired for the second passage through the system. The beams $b'_{30,m}$ and $b'_{30,r}$ are sent to a detector 160 by a reflector 158, passing a polarization analyser 159. The direction of polarization of this analyser extends at an angle of 45° to the two mutually perpendicular directions of polarization of the beams $b'_{30,m}$ and $b'_{30,r}$ so that this analyser passes components of the same directions of polarization of the beams, which components interfere with each other. The output signal $S_{160}$ of the detector 160 then has an intensity modulation at a frequency which is equal to the difference frequency of the beams $b_{30,m}$ and $b_{30,r}$ plus or minus a frequency shift which is determined by the displacement of the substrate support in the Y direction.

To enable measurement of the tilt of the substrate support about the X axis, the reflector 158 may be implemented as a partially transparent mirror. The portions of the beams $b'_{20,m}$ and $b'_{30,r}$ passed by this element are reflected to the beam splitter 151 by a reflector system 161. This system may comprise two mirrors 162 and 163 at an angle of 45° to the X-Y plane in FIG. 15. The mirror 162 reflects the beam portions in the Z direction and the mirror 163 subsequently ensures that the beam portions will extend in the Y direction again, but then in a second X-Y plane which is located in front of or behind the plane of the drawing in FIG. 15. This second plane is the plane of the drawing in FIG. 16, which Figure shows how the beam portions reflected by the system 161 traverse the interferometer unit as a new measuring beam $b_{31,m}$ and a new reference beam $b_{31,r}$ and how they are reflected by the substrate support mirror $R_2$ and the reference mirror 155. A $\lambda/2$ plate 164 is arranged in front of the beam splitter 151, which plate rotates the directions of polarization of the beams through 90° so that the functions of the measuring beam and the reference beam are interchanged. In the presence of a retroreflector 165 the measuring beam is reflected twice as measuring beam $b_{31,m}$ and $b'_{31,m}$ at the positions $P_{y,3}$ and $P_{y,4}$ by the mirror $R_2$ and the reference beam is reflected twice as reference beams $b_{31,r}$ and $b'_{31,r}$ by the reference mirror.

The beams $b'_{31,m}$ and $b'_{31,r}$ ultimately reach a polarization analyser 166 which passes the components having the same direction of polarization of these beams to a detector 167. The output signal $S_{167}$ of this detector has an intensity modulation at a frequency which is equal to the difference frequency of the beams $b_{30,m}$ and $b_{30,r}$ plus or minus a frequency shift which is dependent on a tilt $\phi_x$ of the mirror $R_2$ about the X axis. In fact, if such a tilt occurs, the frequency shift between the measuring beam $b'_{30,m}$ and the reference beam $b'_{30,r}$ differs from the frequency shift between the measuring beam $b'_{31,m}$ and the reference beam $b'_{31,r}$. The frequency difference measured by means of the detector 167 is the difference between these frequency shifts. If the substrate support does not have a tilt about the X axis, the resultant frequency difference is equal to zero.

Figure 17:
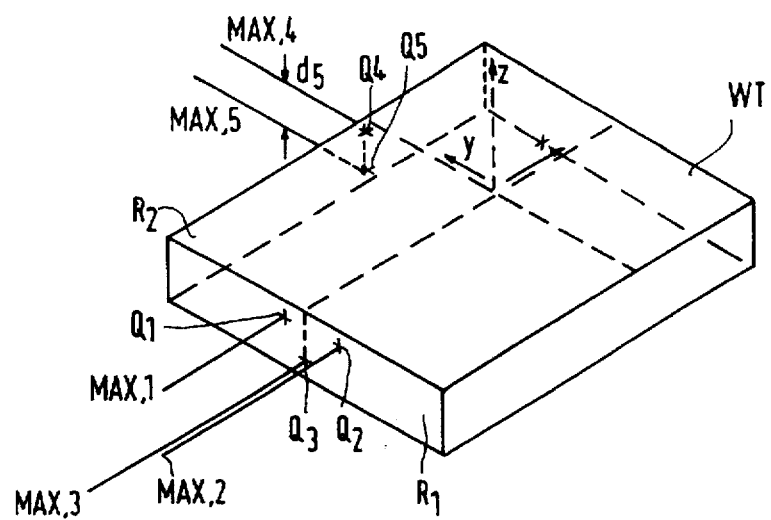
FIG. 17 shows the positions where the five measuring axes of the interferometer system intersect the two mirrors of a substrate support mirror block.

The points $P_{y,3}$ and $P_{y,4}$ where the chief rays of the measuring beams $b_{31,m}$ and $b'_{31,m}$ impinge upon the mirror $R_2$ preferably have the same X positions as the points $P_{y,2}$ and $P_{y,1}$ where the chief rays of the measuring beams $b'_{30,m}$ and $b_{30,m}$ impinge upon this mirror, and the measuring axes $MAX_4$ and $MAX_5$ are directed perpendicularly to the Z axis. This is illustrated in FIG. 17. This Figure not only shows these measuring axes and the points of intersection $Q_4$ and $Q_5$ of these axes with the mirror $R_2$ of the substrate table WT, but also the measuring axes $MAX_1$, $MAX_2$ and $MAX_3$ of the first interferometer unit and the points of intersection $Q_1$, $Q_2$ and $Q_3$ of these axes with the mirror $R_1$ of the substrate table.

In the interferometer unit according to FIGS. 15 and 16 the difference between the signals associated with the measuring axes $MAX_4$ and $MAX_5$, which difference is required for determining the tilt $\phi_x$, is determined optically. If the information obtained via these measuring axes is represented by $I_{MAX,4}$ and $I_{MAX,5}$, the detector signals $S_{160}$ and $S_{167}$ in the embodiment of FIGS. 15 and 16 are given by:

$$S_{160} = I_{MAX,4}$$

$$S_{167} = I_{MAX,4} - I_{MAX,5}$$

The measuring axis information as a function of the detector signals is $I_{MAX,4} = S_{160}$
$I_{MAX,5} = S_{160}S_{167}$ The signals $S(Y)$ and $S(\phi_x)$ representing information about the magnitude and direction of the displacement along the Y axis and of the tilt about the X axis then are:

$$S(Y) = \frac{I_{MAX,4} + I_{MAX,5}}{2} = S_{160} - \frac{1}{2}S_{167}$$

$$S(\phi_x) = \frac{I_{MAX,4} - I_{MAX,5}}{d_5} = \frac{S_{167}}{d_5}$$

in which $d_5$ is the distance between the points $Q_4$ and $Q_5$ in FIG. 17.

Instead of using coupled measuring axes, as is shown in FIGS. 15 and 16, it is possible to use independent measuring axes for operating the interferometer unit 150 analogously as described with reference to the interferometer unit 100. In this case the following relationships apply between the measuring axis information and the detector signals:

$S_{160} = I_{MAX,4}$
$S_{167} = I_{MAX,5}$ and for the measuring signals $S(Y)$ and $S(\phi_x)$:

$$S(Y) = \frac{I_{MAX,4} + I_{MAX,5}}{2} = \frac{1}{2}(S_{160} + S_{167})$$

$$S(\phi_x) = \frac{I_{MAX,4} - I_{MAX,5}}{d_5} = \frac{S_{160} - S_{167}}{d_5}$$

The interferometer unit according to FIGS. 16 and 17 also provides the advantage that the associated measuring and reference beams traverse this unit symmetrically and cover the same distances through the beam splitter 151, which is very favourable from the point of view of stability, i.e. it is independent of temperature, humidity, etc.

In both interferometer units 100 and 150 it is not necessary for the detectors 113, 115, 127, 160 and 167 to be arranged directly behind the analysers 112, 114, 126, 159 and 166, but if desired, these detectors may be arranged at larger distances and possibly close together. Optical fibres can then be used to guide the beams to the detectors. Lenses for focusing the beams on the entrance planes of the fibres may be arranged between the analysers and the fibres.

The prism retroreflectors, or three-dimensional "corner cubes", shown in FIGS. 10, 11, 14, 15 and 16 may also be replaced by so-called cat's eye retroreflectors. Such a cat's eye is constituted by a lens with a mirror arranged in its focal plane and it ensures that not only the principal axis of the reflected beam is parallel to that of the incoming beam, but it also ensures that these principal axes coincide.

In view of the required accuracy of the composite interferometer system, changes of ambient parameters, such as temperature, pressure, humidity may become to play a role. These changes cause a variation of the refractive index of the medium in which the interferometer beams propagate. To be able to determine this variation, so that it can be corrected, the interferometer system according to the invention preferably has a sixth axis which is used as a reference axis along which a beam extends which cooperates with a fixedly arranged mirror. In FIG. 9 this mirror is denoted by the reference numeral 170 and the reference axis beam is denoted by $b_{50}$. The beam $b_{50}$ is preferably supplied by the second interferometer unit 150 and the beam coming from this unit is sent to the mirror 170 by a mirror 171.

FIG. 15 shows how the beam $b_{50}$ can be derived from the beam $b_{30}$, for example, by means of a prism system 175 comprising two reflectors 176 and 177. The first partially transparent reflector 176 reflects a part of the beam $b_{30}$ to the second reflector 177 which sends this part as beam $b_{50}$ to the beam splitter 151. The interface 152 splits the beam $b_{50}$ into a measuring beam $b_{50,m}$ and a reference beam $b_{50,r}$. The last-mentioned beam is reflected to the reference mirror 155, while the measuring beam $b_{50,m}$ is passed on to the mirror 171 which is arranged, for example, at an angle of 45° to the plane of the drawing in FIG. 15. The measuring beam $b_{50,m}$ reflected by the fixedly arranged mirror 170 enters the beam splitter 151 via the mirror 171, in which beam splitter it is combined with the reference beam $b_{50,r}$ reflected by the reference mirror 155. Via a polarization analyser 179 the combined beam reaches a detector 180 which may be arranged behind the prism system if the reflector 177 is a partially transparent reflector.

The measuring beam $b_{50,m}$ traverses a constant geometrical path length. The optical path length, which is the product of the geometrical path length and the refractive index of the medium, is, however, influenced by a variation of the refractive index, hence also by the path length difference between the measuring beam $b_{50,m}$ and the reference beam $b_{50,r}$. The variation of the path length difference is measured by means of the detector 180 and the output signal $S_{180}$ can be used to correct the information obtained via the other measuring axes for the refractive index variations due to variations of the ambient parameters.

As is shown in FIG. 9, the reference mirror 170 for the reference axis is connected to the interferometer unit 150, preferably via a plate 190 of very stable material such as "zerodure" or "Invar". A very stable construction for the reference axis is then obtained.

The information of the reference axis of the six-axis interferometer system may also be used for correcting the measuring information from other optical measuring systems, such as a focus error detection system and/or a system for detecting local levelling of the substrate surface, if the beams of these measuring systems traverse the same space as the interferometer beams.

Due to changes of the ambient parameters such as air pressure, temperature, humidity, etc. the refractive index of the medium within the projection lens system may be affected, which may result in variations of the imaging quality of the projection lens system. The signal generated by means of the reference axis of the composite interferometer system may be used for correcting the imaging quality. This may be effected, for example, by adjusting one or more of the following parameters:

the wavelength of the projection beam
the gas pressure within the projection lens system
the temperature within the projection lens system
the composition of the medium in one or more of the compartments within the projection lens system
the mutual distance between the lens elements in the projection lens system.

Furthermore, also
the zero setting of the alignment device, and
the zero setting of the focusing device could be adjusted by means of said signal.

To obtain the control signals required for this purpose, the output signal $S_{180}$ of the detector 180 is applied to an electronic signal processing unit 185. As is diagrammatically shown in FIG. 15 by means of the signals $SR_1 \ldots SR_n$, various servosystems of the projection apparatus can be controlled from the unit 185. It is to be noted that the zero adjustments and the correction of the imaging quality by means of the reference axis signal may alternatively be realised in an apparatus without local levelling of the object or substrate.

For measuring variations of the refractive index it is sufficient to use one measuring beam. However, if desired, a double measuring beam and a double reference beam may also be realised for the reference axis, as has been described in the foregoing for the other measuring axes. In that case the measuring beam $b_{50,m}$ and the reference beam $b_{50,r}$ must traverse the λ/4 plate 153 and the λ/4 plate 154, respectively, and a retroreflector at the location of the retroreflector 156 must also be arranged for the reference axis. The measuring and reference beams of the reference axis than traverse the system according to FIG. 15 in an analogous way as the measuring beams $b_{30,m}$, $b'_{30,m}$ and the reference beams $b_{30,r}$, $b'_{30,r}$ of the fourth measuring axis.

Figure 18:
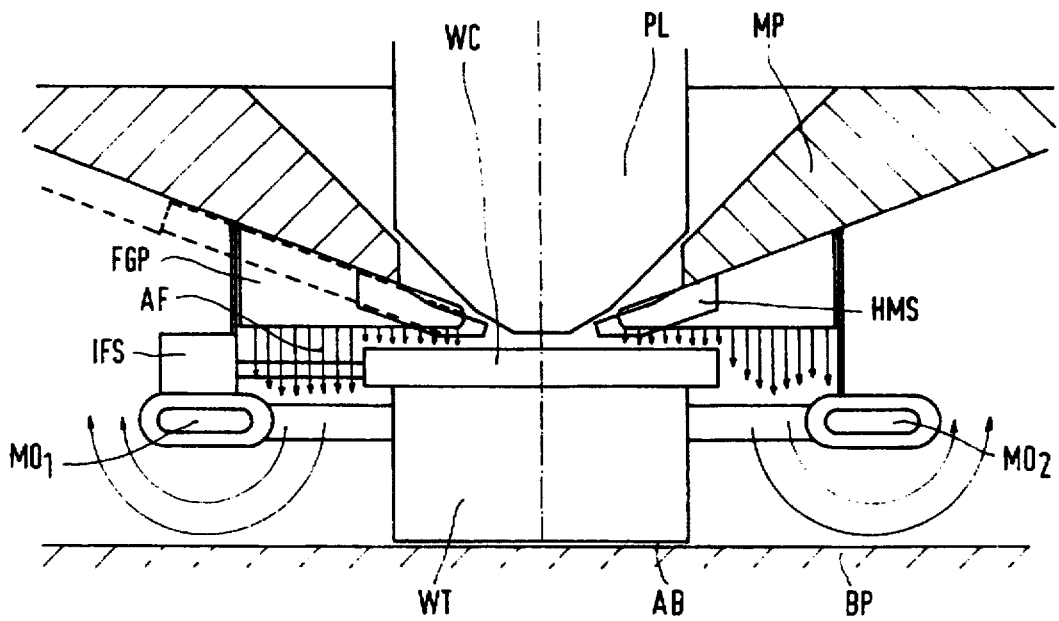
FIG. 18 shows a part of a projection apparatus with a stream of air for conditioning the space in which the interferometer beams propagate.

An even greater accuracy of the composite interferometer system can be obtained if it is ensured that the same circumstances prevail in the entire space in which the interferometer beams propagate. This can be realised by passing a constant, preferably laminar stream of air through this space. This is illustrated in FIG. 18. This Figure diagrammatically shows a part of the projection lens system PL and the substrate support WC integrated with the mirror block. The substrate support forms part of a substrate table WT WH which can move across a base plate BP via an air cushion AB under the control of a drive system in a H-configuration described in, for example, U.S. Pat. No. 4,665,594, whose components are denoted by $MO_1$ and $MO_2$ in FIG. 18. A mounting plate MP on which a holder HMS for optical measuring systems such as, for example, a focus error detection system and/or a system for detecting whether the substrate surface is locally horizontal is arranged under, and preferably connected to the projection lens system. The interferometer system, which is diagrammatically shown by IFS, is preferably also secured to the mounting plate. Said air stream is denoted by the arrows AF. This air stream is passed through an air stream conducting plate FGP. This plate may be dimensioned in such a way that also the space above the substrate to be illuminated is covered so that this substrate is present in a well-conditioned space.

Both the purity and the temperature of the supplied air can be controlled. This air is, for example, of purity class 1 and its temperature is, for example, stable within 0.1° C. The latter can be achieved by arranging a heat exchanger in the vicinity of the interferometer system and the substrate support.

In addition to the embodiments shown in FIGS. 10, 11, 14, 15 and 16, various other embodiments of the interferometer units are possible. Several other possibilities will be described hereinafter.

Figure 19:
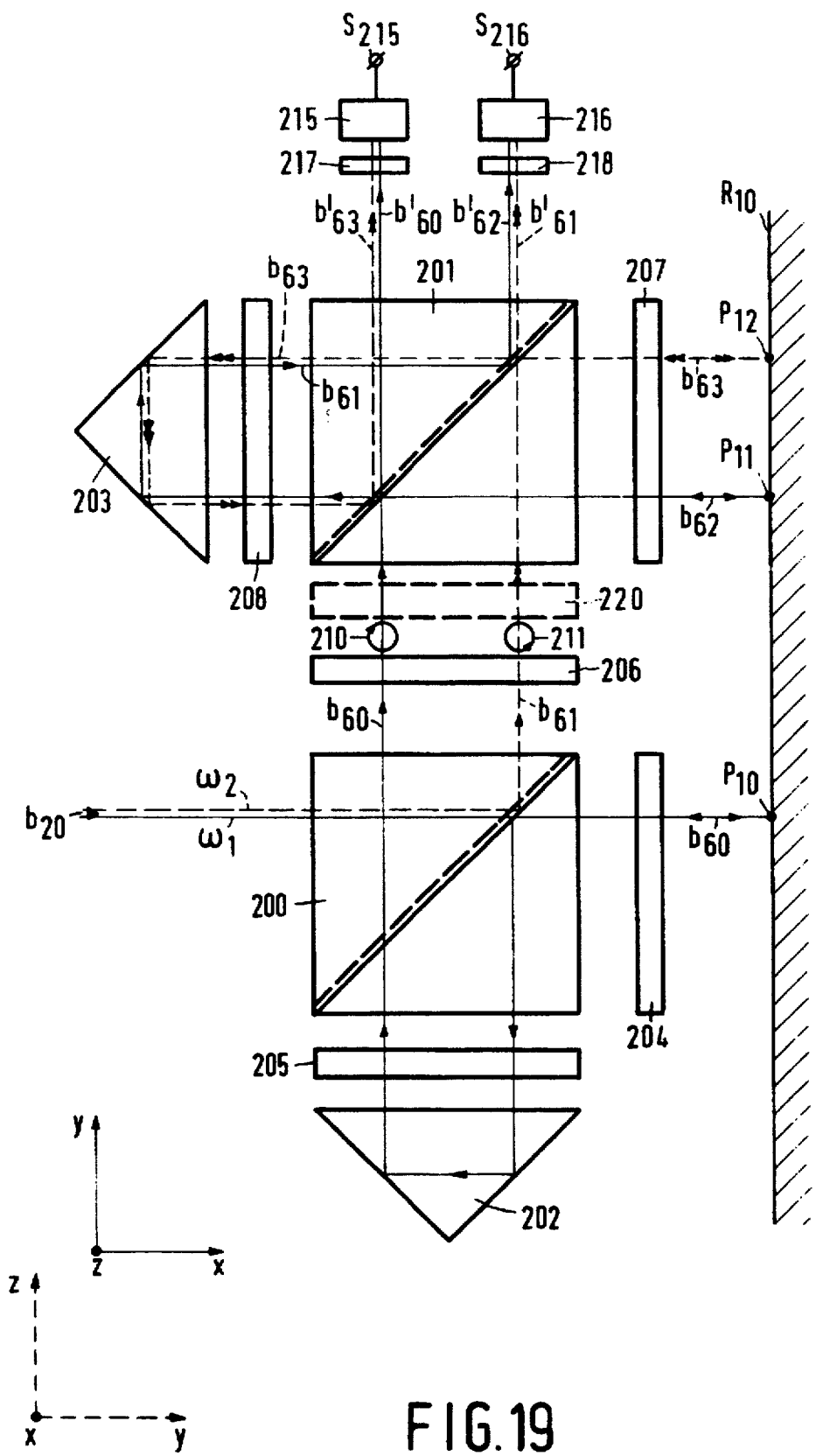
FIGS. 19 and 20 show a second embodiment of a three-axis interferometer unit in accordance with two cross-sections in different XY planes.

The interferometer unit of FIG. 19 comprises two polarization-sensitive beam splitters 200, 201, two retroreflectors 202, 203 and five λ/4 plates 204, 205, 206, 207, 208. This interferometer unit does not comprise reference mirrors. The incoming beam $b_{20}$ again comprises two components having mutually perpendicular directions of polarization and different frequencies $\omega_1$ and $\omega_2$, which components are denoted by solid lines and broken lines respectively. The component of the frequency $\omega_1$ is passed as beam $b_{60}$ to the substrate support mirror $R_{10}$ and reflected by this mirror to the beam splitter 200. The beam $b_{60}$ reaching this beam splitter has traversed the λ/4 plate 204 twice so that its direction of polarization is rotated through 90°, so that the beam is reflected to the retroreflector 202. This retroreflector again reflects the beam to the beam splitter 200. The direction of polarization of the beam incident thereon is rotated through 90° again so that the beam $b_{60}$ is now passed on to the λ/4 plate 206. This plate converts the linearly polarized radiation into circularly polarized radiation, for example, dextrocircularly polarized radiation which is denoted by the circle 210. This circularly polarized light is composed of two linearly polarized components, one of which is passed as beam $b'_{60}$ by the second beam splitter 201 to a polarization analyser 217 and a first detector 215. The beam $b'_{60}$ has been reflected once by the mirror $b_{10}$ at the position $P_{10}$.

The second component of the beam $b_{60}$ is reflected as beam $b_{62}$ by the beam splitter 201 to the mirror $R_{10}$ which returns this component to the beam splitter 201. Due to the 90° polarization rotation resulting from the double passage through the λ/4 plate 207, the beam splitter 201 passes the beam $b_{62}$ to the retroreflector 203. On its way to and from this reflector the beam $b_{62}$ again passes a λ/4 plate twice, namely plate 208, so that it is subsequently reflected as beam $b'_{62}$ by the beam splitter 201 to an analyser 218 and a second detector 216. The beam $b'_{62}$ has been reflected twice by the mirror $R_{10}$, once at the position $P_{10}$ and once at the position $P_{11}$.

The component of the beam $b_{20}$ with frequency $\omega_2$ is reflected as beam $b_6l$ by the beam splitter 200 to the λ/4 plate 206, which converts the linearly polarized light into, for example, levocircularly polarized light, which is denoted by the circle 211. One of the components of this light is reflected as beam $b_{63}$ to the mirror $R_{10}$ by the beam splitter 201. After reflection by the mirror $R_{10}$ the beam $b_{63}$ traverses the beam splitter 201 and the retroreflector 203 so as to be subsequently incident on the beam splitter 201 which reflects the beam as beam $b'_{63}$ to the detector 215. The λ/4 plates 207 and 208 then again ensure the desired rotations of the direction of polarization. The beam $b'_{63}$ has been reflected once by the mirror $R_{10}$, at the position $P_{12}$. The other component of the circularly polarized beam $b_{61}$ is passed as beam $b'_{61}$ by the beam splitter 201 to the detector 216. This beam has not met the mirror $R_{10}$.

The beam $b'_{61}$ functions as a reference beam which interferes with the beam $b'_{62}$ which has been reflected twice at positions $P_{10}$ and $P_{11}$ by the mirror $R_{10}$. The detector signal $S_{216}$ then comprises information about the displacement of the mirror $R_{10}$ along an axis in the plane of the drawing and perpendicular to the mirror. Since the beam $b'_{60}$ comes from the position $P_{10}$, while the beam $b'_{63}$ comes from the position $P_{12}$, the signal $S_{215}$ of the detector 215 receiving these beams comprises information about the difference between the displacements in the direction perpendicular to the mirror $R_{10}$ and in the plane of the drawing of FIG. 19 of the mirror $R_{10}$ at the area of the position $P_{10}$ and at the area of the position $P_{12}$. If such a difference occurs, the mirror rotates about an axis perpendicular to the plane of the drawing.

The embodiment of FIG. 19 may be used as the interferometer unit 150 of FIG. 9 for measuring a displacement of the substrate table and mirror along the Y axis and a tilt thereof about the X axis. A system of coordinates as is denoted by broken lines in FIG. 19 is then associated with the interferometer unit, i.e. with the X axis perpendicular to the plane of the drawing, and the mirror $R_{10}$ of FIG. 19 then is the mirror $R_2$ of FIG. 9. The detector signal $S_{215}$ then comprises information about the tilt $\phi_x$ of the mirror $R_2$ about the X axis, while the detector signal $S_{216}$ comprises information about the displacement along the Y axis.

If extended with a third measuring axis, the embodiment of FIG. 19 may also be used as the interferometer unit 100 of FIG. 9 for determining a displacement along the X axis, a rotation about the Z axis and a tilt about the Y axis. Then the system of coordinates is the system shown by means of solid lines in FIG. 19, i.e. with the Z axis perpendicular to the plane of the drawing and the mirror $R_{10}$ of FIG. 19 then is the mirror $R_1$ of FIG. 9.

The detector signal $S_{215}$ then comprises information about the rotation $\phi_z$ of the mirror $R_1$ and hence of the substrate support about the Z axis, while the detector signal $S_{216}$ comprises information about the displacement along the X axis. For measuring the tilt about the Y axis, a polarization-insensitive beam splitter 220 which reflects a portion of beams with frequencies $\omega_1$ and $\omega_2$ in the Z direction and an extra reflector which subsequently deflects the beams so that they will extend in a second X-Y plane can be arranged between the λ/4 plate 206 and the beam splitter 201.

Figure 20:
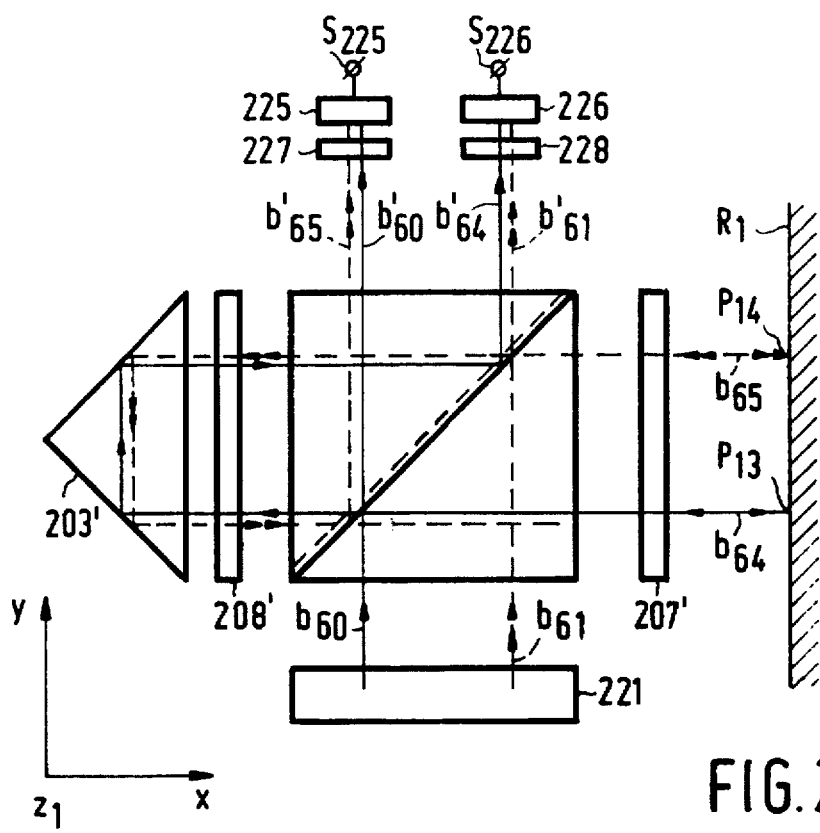

The second X-Y plane is shown in FIG. 20 together with the newly formed beams $b_{64}$ and $b_{65}$ and the extra reflector 221. These beams pass the same system as that shown in the upper part of FIG. 19. The beam $b_{64}$ is reflected by the mirror $R_1$ at a position $P_{13}$ and ultimately reaches, as beam $b'_{64}$, a detector 226, together with the beam $b'_{61}$, via an analyser 228. The last-mentioned beam, which has not met the mirror $R_1$, functions as a reference beam for the beam $b'_{64}$ which has been reflected once by the mirror $R_1$ at the position $P_{10}$ (FIG. 19) and once at the position $P_{13}$. The output signal $S_{226}$ then comprises information about the displacement, averaged over the positions $P_{10}$ and $P_{13}$, of the mirror $R_1$ in the X direction. The beam $b_{65}$ is reflected by the mirror $R_1$ at the position $P_{14}$ and reaches, as beam $b'_{65}$, the detector 225 via an analyser 227, together with the beam $b'_{60}$ which has been reflected once by the mirror $R_1$ at the position $P_{10}$ (FIG. 19). The output signal $S_{225}$ comprises information about the tilt of the mirror $R_1$ about the Y axis.

The elements of FIG. 20 have the same reference numerals as those of the upper part of FIG. 19, but they are primed so as to indicate that the elements of FIG. 20 may be either the same as those of FIG. 19 or separate and similar elements. In the first case the points $P_{13}$ and $P_{14}$ have the same Y positions as the points $P_{11}$ and $P_{12}$, while in the second case the Y positions of $P_{13}$ and $P_{14}$ can still be freely chosen.

In the interferometer unit according to FIGS. 19 and 20 (n+1) measuring beams are required (the information of the detector 226 is redundant information) for measuring along n measuring axes, while 2n measuring beams are required in the interferometer units according to FIGS. 10, 11, 14, 15 and 16. In the interferometer unit according to FIGS. 19 and 20, however, the radiation paths are not symmetrical so that more stringent requirements must be imposed on the stability.

Figure 21:
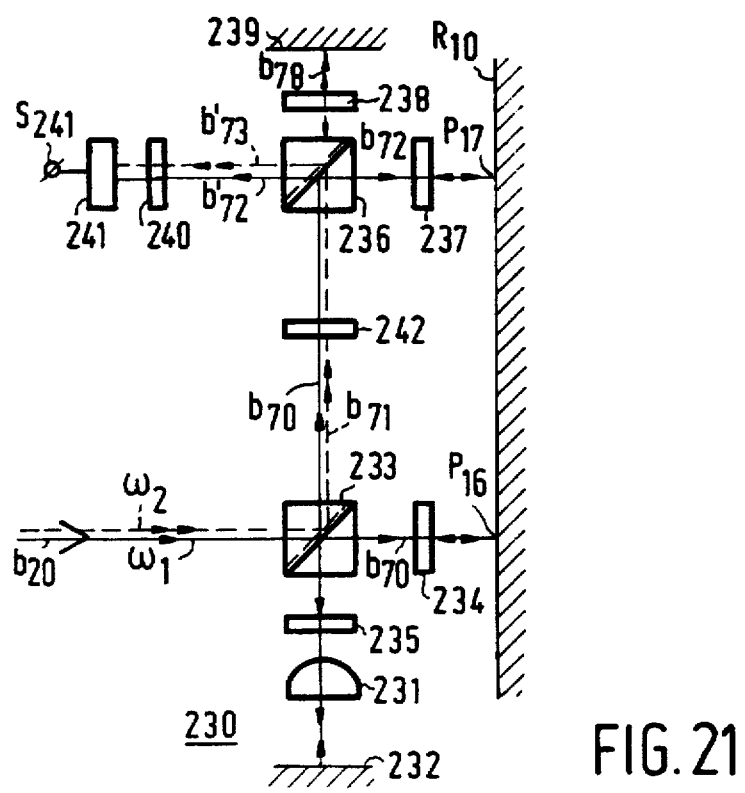
FIGS. 21, 22 and 23 show the principle and the construction of a third embodiment of a two-axis interferometer unit.
Figure 22:
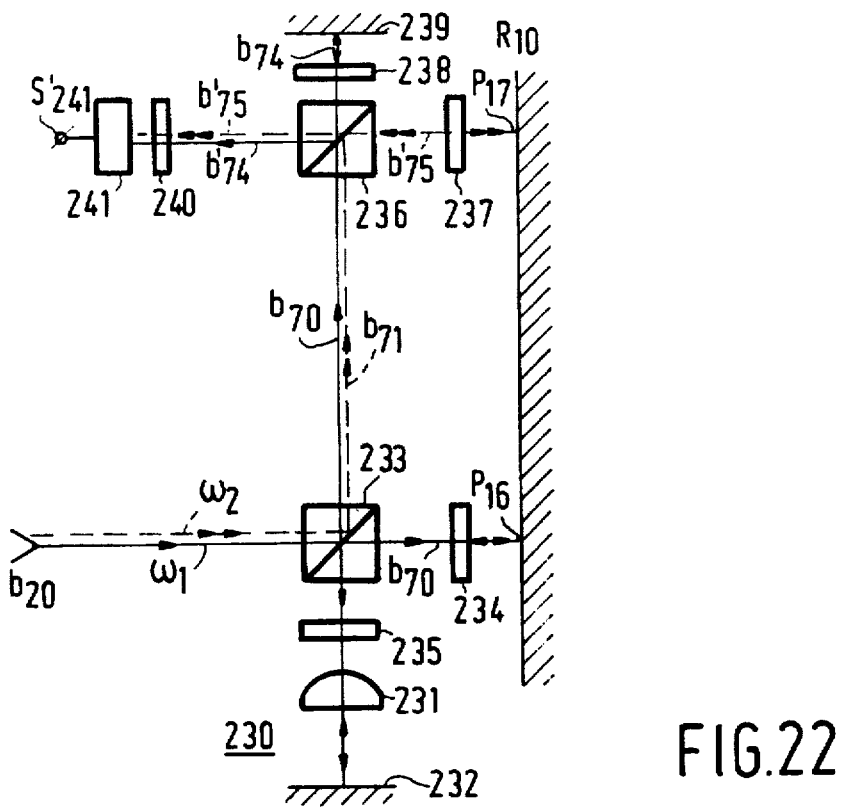

FIGS. 21 and 22 show the principle of a further embodiment of an interferometer unit. In this unit a so-called cat's eye 230 is used as a retroreflective element. It consists of a lens 231 and a reflector 232 arranged in its focal plane. The cat's eye reflects a beam in such a way that the chief ray of the reflected beam coincides with that of the incident beam. This provides the possibility of a compact structure.

The component of the frequency $\omega_1$ of the incoming beam $b_{20}$ is passed as beam $b_{70}$ by the beam splitter 233 to the mirror $R_{10}$ and reflected by this mirror to the beam splitter 233. Since the beam has meanwhile passed the λ/4 plate 234 twice, its direction of polarization is rotated through 90° so that it is now reflected to the cat's eye 230. The beam reflected by this element has passed the λ/4 plate 235 twice so that it is passed by the beam splitter 233. If a λ/2 plate 242 is provided, the direction of polarization of the beam $b_{70}$ is rotated through 90° again and this beam is passed as beam $b_{72}$ to the mirror $R_{10}$ by the beam splitter 236. The direction of polarization of the beam $b_{72}$ again reaching the beam splitter 236 is rotated through 90° due to the double passage through the λ/4 plate 237 so that it is now passed on as beam $b'_{72}$ to an analyser 240 and a detector 241 arranged behind it.

The component of the frequency $\omega_2$ of the beam $b_{20}$ is reflected as beam $b_{71}$ to the beam splitter 236 by the beam splitter 233. The λ/2 plate 242 rotates the direction of polarization of this beam through 90° so that it is passed on as beam $b_{73}$ to the mirror 239 by the beam splitter 236. The direction of polarization of the beam $b_{73}$ reflected by this mirror is rotated through 90° again by the λ/4 plate 238 so that this beam is reflected as beam $b'_{73}$ to the detector 241 by the beam splitter 236.

The beam $b'_{73}$, which has not met the mirror $R_{10}$, is a reference beam for the beam $b'_{72}$ which has been reflected twice by the mirror $R_{10}$ at the positions $P_{16}$ and $P_{17}$. The output signal $S_{241}$ of the detector 241 then comprises information about the average value of the displacement at the positions $P_{16}$ and $P_{17}$ of the mirror $R_{10}$ in the direction perpendicular to the mirror and in the plane of the drawing.

If the λ/2 plate 242 is omitted, as is shown in FIG. 22, the beam $b_{70}$ is passed as beam $b_{74}$ by the beam splitter 236 to the reflector 239, while the beam $b_{71}$ is reflected as beam $b_{75}$ to the mirror $R_{10}$. Two beams $b'_{74}$ and $b'_{75}$ both of which have been reflected once by the mirror $R_{10}$ at the positions $P_{16}$ and $P_{17}$, respectively, are now incident on the detector 241. The detector signal $S'_{241}$ then comprises information about the tilt of the mirror $R_{10}$ about an axis perpendicular to the plane of the drawing.

Figure 23:
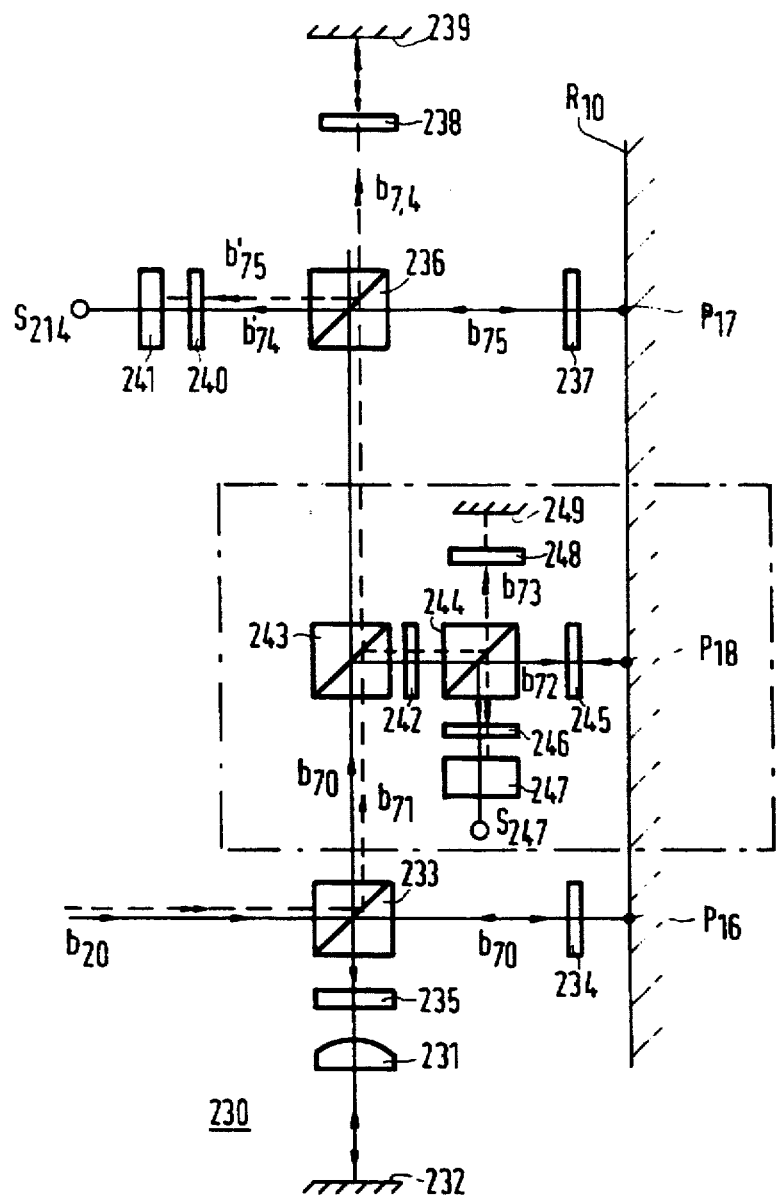

FIG. 23 shows how the possibilities shown in FIGS. 21 and 22 can in principle be combined in one interferometer unit. The interferometer unit of FIG. 23 comprises the elements of FIG. 22 in the lower and upper parts of FIG. 23, with which the tilt of the mirror $R_{10}$ about the axis perpendicular to the mirror $R_{10}$ and in the plane of the drawing can thus be determined. The interferometer of FIG. 23 comprises as additional components the part in the dot-and-dash line frame in which a polarization-neutral beam splitter 243 is present which splits off a certain portion of the beams $b_{70}$ and $b_{71}$. The split-off beam portions traverse, as beams $b_{72}$ and $b_{73}$, a system whose elements 242, 244, 245, 246, 247, 248 and 249 have the same function as the elements 242, 236, 237, 240, 241, 238 and 239 of FIG. 21. The output signal of the detector 247 comprises information about the displacement of the mirror $R_{10}$, averaged over the positions $P_{16}$ and $P_{18}$, along an axis perpendicular to the mirror and in the plane of the drawing, analogously as the detector signal $S_{241}$ in FIG. 21.

The interferometer unit of FIG. 23 can be used again as unit 150 of FIG. 9 or, if extended by an extra measuring axis, as unit 100 of FIG. 9. The extra measuring axis can be obtained by splitting a part of the radiation of the beams $b_{70}$ and $b_{71}$, analogously as described with reference to FIGS. 19 and 20, in a direction perpendicular to the plane of the drawing in FIG. 23 and by a sub-system in the path of the split beam, analogous to the sub-system within the frame in FIG. 23.

Figure 24:
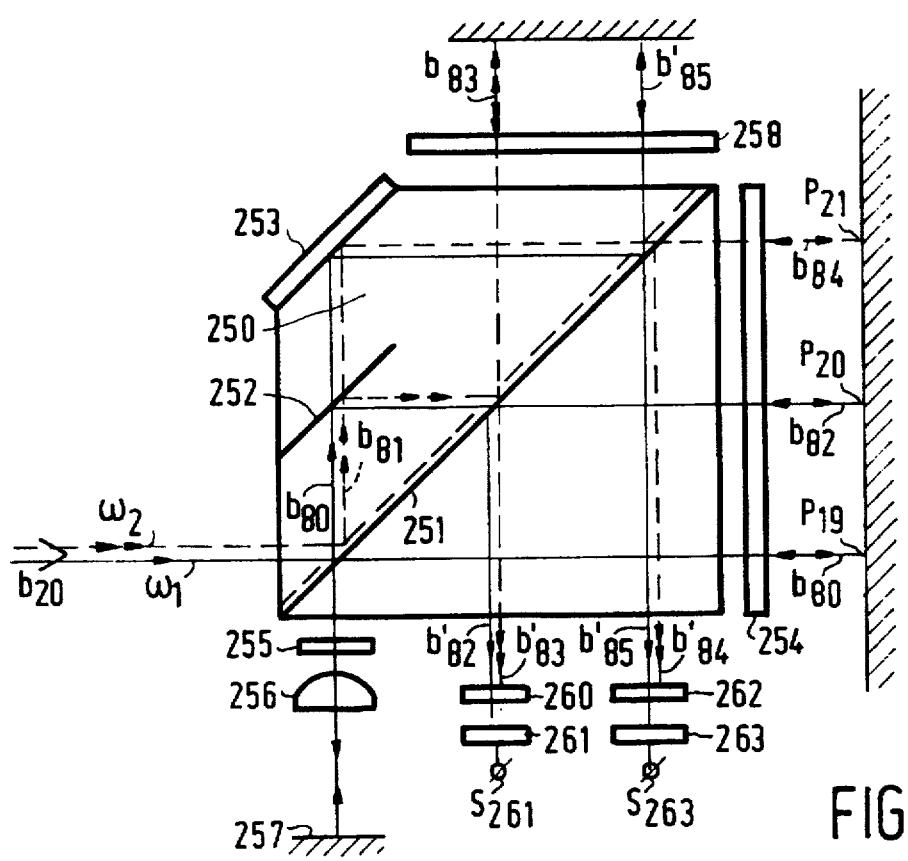
FIG. 24 shows a fourth embodiment of a two-axis interferometer unit.

FIG. 24 shows another embodiment of an interferometer unit which is based on the same principle as that of FIGS. 21, 22 and 23. The embodiment of FIG. 24 comprises one beam splitter 250 having a polarization-sensitive separating layer 251, a polarization-neutral separating layer 252 and a λ/2 plate 253. Furthermore, only three λ/4 plates 254, 255 and 258 and one reference mirror 259 are required to carry out the same measurements as with the unit of FIG. 23.

The beam component of frequency $\omega_1$ is passed as a first measuring beam $b_{80}$ by the layer 251 to the mirror $R_{10}$ on which the measurement must take place, by which mirror it is reflected at the position $P_{19}$. This beam subsequently reaches the separating layer 252 via the cat's eye 256, 257, which layer reflects a portion of the beam to the separating layer 251. This layer passes this beam portion as second measuring beam $b_{82}$ to the mirror $R_{10}$. The beam reflected at the position $P_{20}$ is finally reflected by the separating layer 251 so as to reach, as beam $b'_{82}$, a first analyser 260 and a first detector 261 arranged behind it. The beam component of the frequency $\omega_2$ is reflected as beam $b_{81}$ by the layer 251 to the layer 252. This layer reflects a portion of the beam $b_{81}$ to the separating layer 251 which reflects this beam portion as beam $b_{83}$ to the reference mirror 259. The beam reflected by this mirror reaches as beam $b'_{83}$ also the first detector 261. The beam $b'_{83}$ has not met the mirror $R_{10}$, while the beam $b'_{82}$ has been reflected by the mirror $R_{10}$ at the positions $P_{19}$ and $P_{20}$. The output signal $S_{261}$ of the detector 261 therefore comprises information about the displacement, averaged over the positions $P_{19}$ and $P_{20}$ of the mirror $R_{10}$, along the axis perpendicular to the mirror and in the plane of the drawing.

The direction of polarization of the portions of the beams $b_{80}$ and $b_{81}$ passed by the polarization-neutral layer 252 is rotated through 90° by the $\lambda/2$ plate 253 so that the passed portion of the beam $b_{81}$ is passed as the third measuring beam $b_{84}$ by the layer 251 to the mirror $R_{10}$, reflected by this mirror at the position $P_{21}$ and finally reflected by the layer 251 as beam $b'_{84}$ to a second analyser 262 and a second detector 263. The portion of the beam $b_{80}$ passed by the layer 252 is reflected, after reflection by the $\lambda/2$ plate 253, as beam $b_{85}$ by the layer 251 to the reference mirror 259 and is finally reflected as beam $b'_{85}$ by this mirror to the second detector 263. The beams $b'_{84}$ and $b'_{85}$ both have been reflected once at the positions $P_{21}$ and $P_{19}$, respectively, so that the output signal $S_{263}$ comprises information about a tilt of the mirror $R_{10}$ about an axis perpendicular to the plane of the drawing.

Figure 25:
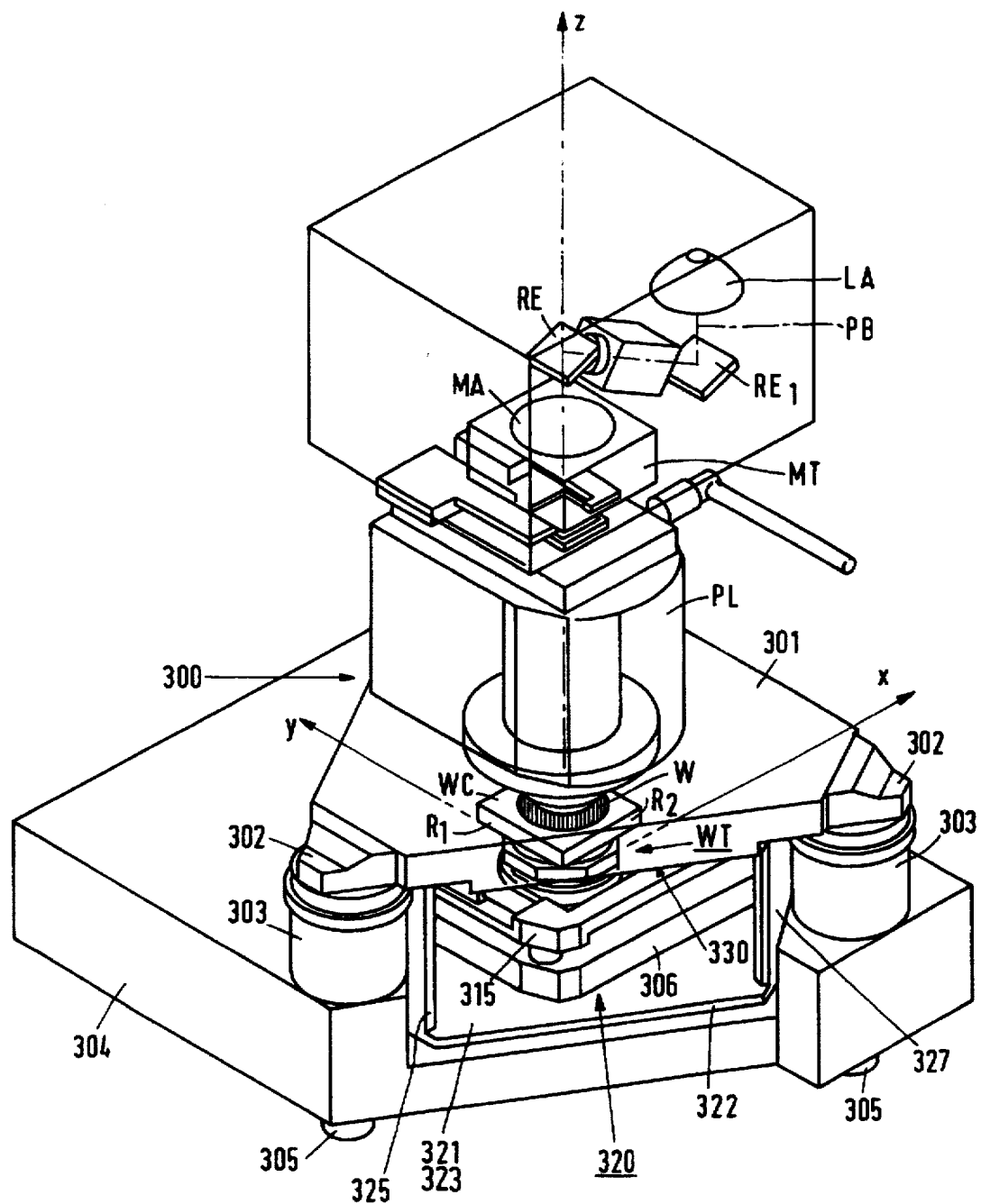
FIG. 25 is a perspective elevational view of an embodiment of a projection apparatus.
Figure 26:
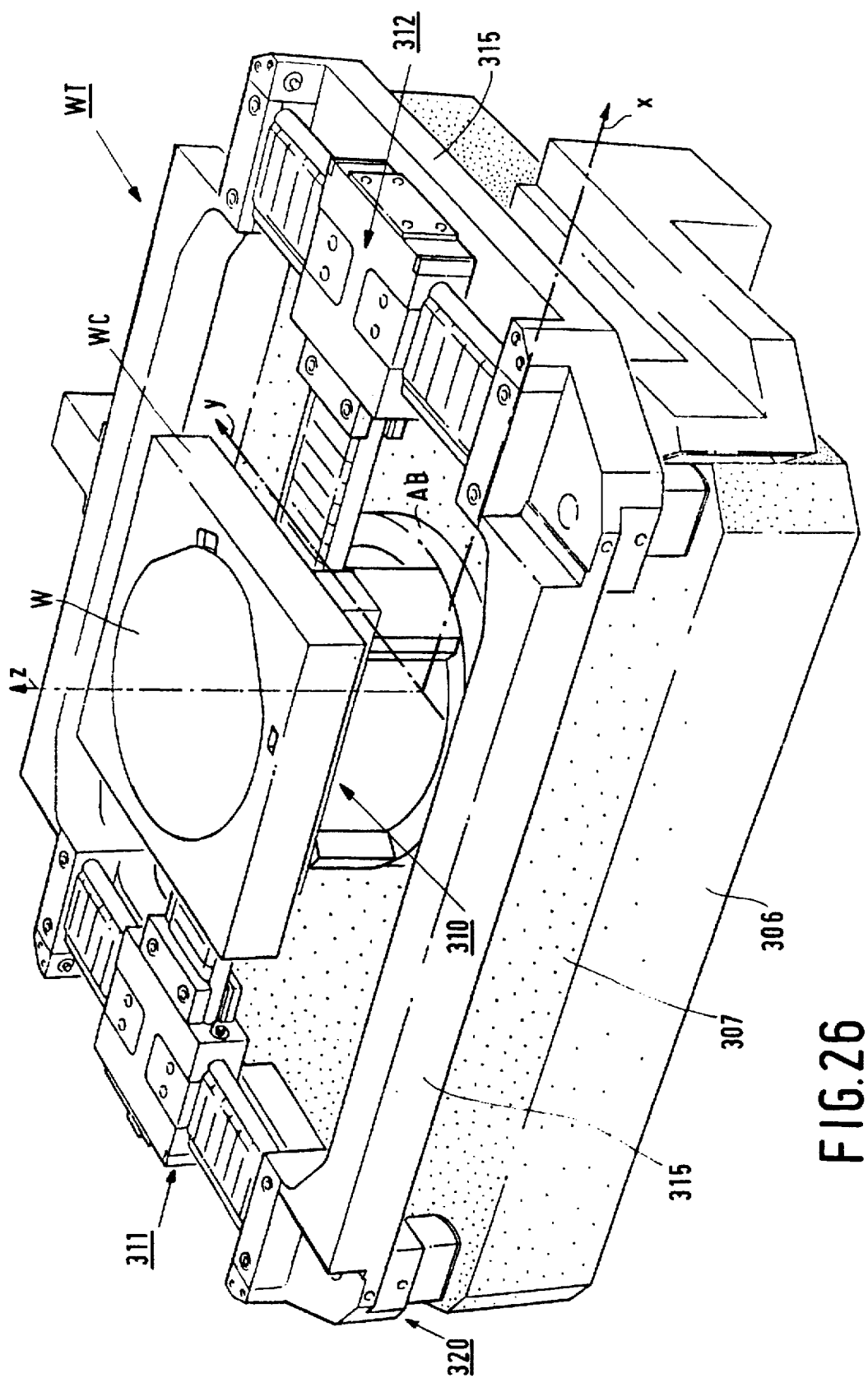
FIG. 26 is a perspective elevational view of a substrate table for this apparatus.

To clarify and complete the foregoing description, perspective elevational views of an embodiment of a projection apparatus and a substrate table for this apparatus are shown in FIGS. 25 and 26, respectively.

In FIG. 25 the reference LA denotes a radiation source whose beam PB, illustrated by means of its chief ray, illuminates the mask MA via the mirrors $RE_1$ and $RE$. The reference BE denotes an optical system which widens the beam and makes it uniform. The mask is supported by a mask manipulator or table MT. The reference PL denotes the projection lens system which images the mask pattern present in the mask on a sub-area of the substrate W which is supported by a substrate support WC integrated with the mirror block denoted by the mirrors $R_1$ and $R_2$. The substrate support is a component of a substrate table WT and is step-wise displaceable parallel to the X direction which is perpendicular to the Z direction and parallel to the Y direction which is perpendicular to the Z direction and the X direction, so that the semiconductor substrate can be illuminated in a large number of different illumination positions.

The projection lens system is secured at the lower side to a mounting member 301 which forms part of a machine frame 300 of the apparatus. The mounting member 301 is a triangular plate extending in a plane perpendicular to the Z direction. This plane has three corner parts 302 each resting on a frame stand 303. FIG. 25 only shows two corner parts 302 and two frame stands 303. The frame stands are arranged on a base 304 of the machine frame 300 which is placed on a flat floor by means of adjusting members 305.

As is shown in FIG. 26, the integrated substrate support and mirror block unit WC is guided by means of an air base AB provided with a static gas bearing along an upper face 307 of a supporting member 306 in the form of a rectangular granite stone. The substrate support is displaceable across the upper face 307 by means of a positioning device which is provided with the linear motors 301, 311 and 312 arranged in a H configuration as mentioned hereinbefore and as known from U.S. Pat. No. 4,665,594. As is shown in FIG. 26, the linear motors 311 and 312 are secured to a frame 315 which is secured near its corners to the upper face 307 of the supporting member 306. The substrate support WC is displaceable parallel to the X direction by means of the linear motor 310 and parallel to the Y direction by means of the linear motors 311 and 312 and is rotatable through a very limited angle about an axis of rotation which is parallel to the Z direction.

As is shown in FIGS. 25 and 26, the supporting member 306 and the positioning device constitute a unit 320 which is arranged on a support 321 of the machine frame 300. The support 321 is a triangular plate extending perpendicularly to the Z direction, one main side 322 of which plate is shown in FIG. 25. Each main side of this plate extends between two frame stands 303. The supporting member 306 is secured to an upper side 323 of the support 321. This support is suspended from the lower side 330 of the mounting member 301 by means of thin plate-shaped steel suspension elements only two of which, 325 and 327, are shown in FIG. 25. All suspension elements are formed from a plate extending in the vertical plane parallel to the Z direction, the vertical planes mutually enclosing angles of 60°.

The novel method and device have been explained hereinbefore with reference to their use in a projection apparatus for repetitively imaging a mask pattern on a substrate, with the substrate being locally levelled and the tilt measuring signals being used for correcting the other interferometer signals. Something similar may also occur in other apparatuses, for example in apparatuses for manufacturing patterns such as IC patterns, which work with a laser beam or an electron beam, so that the method and device can also be used in these apparatuses.

Moreover, the device described, notably the interferometer system, can also be used in apparatuses in which positioning without local levelling must take place and in which the tilt measuring signals are used to eliminate the tilt by means of an actuator system. These apparatuses may also be pattern-generating apparatuses operating with a laser beam or an electron beam, but also IC projection apparatuses operating with X-ray radiation, or very accurate X-Y position measuring apparatuses, for example, those which are used for measuring masks.

I claim:

1. A method of repetitively imaging, by means of a projection system, a mask pattern present in a mask plate each time on a different sub-area of an area on a substrate arranged on a substrate support, whereby before the mask pattern is imaged on an individual sub-area, this sub-area is accurately positioned with respect to the mask pattern, which positioning comprises global alignment of the substrate with respect to the mask pattern by two alignment marks located in the mask plate outside the mask pattern and at least two substrate alignment marks located on the substrate outside said area, said global alignment being realized by:

imaging mask alignment marks and substrate alignment marks onto each other by the projection system;

observing the extent of overlap between an alignment mark image and the alignment mark on which the image must be formed;

displacing along a first, X axis and a second, Y axis of a three-axes system of coordinates and rotation about the third, Z axis of the system of coordinates of the mask pattern and the substrate relative to each other until a sufficient degree of overlap is obtained;

positioning each individual sub-area with respect to the mask pattern by displacing the substrate and the mask pattern relative to each other from the global-aligned position while measuring the displacement along at least one of said X and Y axis, the rotation about the Z axis and tilts about the X and Y axis of the substrate; and using all measuring results to realize the ultimate positioning of the relevant sub-area in an X-Y plane with respect to the mask pattern.

2. A method as claimed in claim 1, characterized in that a composite five-axis interferometer system is used for measuring the displacements, the rotation and the tilts of the substrate.

3. A method as claimed in claim 1, in which a local levelling is performed for each substrate sub-area, characterized in that the result of the tilt measurements is used to correct the result of the displacement measurements.

4. A method as claimed in claim 1, characterized in that the result of the tilt measurements is used to level the substrate.

5. A device for accurately displacing and positioning an object with respect to a reference, said object being rigidly fixed to an object holder forming part of and being supported in an object stage, said device comprising the object stage, an X-Y-$\phi z$ drive for moving the object and an interferometer system comprising interferometer mirrors, for measuring displacements of the object along an X axis and a Y axis and a rotation $\phi z$ about a Z axis of a three-axis system of coordinates, the interferometer system comprising five measuring axes and being capable of measuring tilts of the object about the X and Y axes, the interferometer mirrors comprising reflecting side surfaces of the object holder and the interferometer mirrors thereby being stationary with respect to the object such that the interferometer system directly measures all object movements including movements due to stage movements, and the accuracy of said device being such that each sub-area of an object surface can be accurately and directly positioned with respect to the reference without the use of additional alignment means for each sub-area.

6. A device as claimed in claim 5, for use in an apparatus in which an object must be locally levelled, characterized in that the interferometer mirrors reach at most as far as an object support surface on which surface an object is to be arranged and in that an interferometer signal processing unit is provided for converting all interferometer signals into control signals for the X-Y-$\phi_z$ drive.

7. A device as claimed in claim 5, characterized in that an interferometer signal processing unit is provided for converting the interferometer signals into control signals for the X-Y-$\phi_z$ drive and into control signals for actuators eliminating tilts of the object.

8. A device as claimed in claim 5, characterized in that the interferometer system has a sixth, reference, axis whose measuring beam cooperates with a stationary reflector.

9. A device as claimed in claim 5, characterized in that in the path of the measuring beam of each measuring axis a retroreflector is arranged, which retroreflector passes said measuring beam, after a first reflection by a mirror of the object support, back to said mirror for a second reflection on said mirror.

10. A device as claimed in claim 5, characterized in that the interferometer system comprises a first and a second interferometer unit, the first unit supplying the measuring beams for measuring along three measuring axes and the second unit supplying the measuring beams for measuring along two measuring axes.

11. A device as claimed in claim 10, wherein the interferometer system has a sixth, reference axis whose measuring beam cooperates with a stationary reference mirror, characterized in that the measuring beam for the reference axis comes from the second interferometer unit.

12. A device as claimed in claim 11, characterized in that the reference mirror for the reference axis is fixedly connected to the second interferometer unit.

13. A device as claimed in claim 10, characterized in that the two interferometer units have a common radiation source.

14. A device as claimed in claim 5, characterized in that the radiation source is a laser source supplying two components having different frequencies and mutually perpendicular directions of polarization.

15. A device for accurately displacing and positioning an object with respect to a reference, said object being rigidly fixed to an object support incorporated in an object table, said device comprising the object table, an X-Y-$\phi_z$ drive for the object and an interferometer system for measuring displacements along an X axis and a Y axis and a rotation $\phi_x$ about a Z axis of a three-axis system of coordinates, the interferometer system having five measuring axes; the interferometer system comprising a first and a second interferometer unit, each unit comprising a subsystem of optical elements including a separate interferometer mirror, said subsystem comprising a separate interferometer beam splitter for forming interferometer beams arranged along measuring axes and a plurality of detectors equal to the number of measuring axes, the first interferometer unit having three measuring axes, for measuring a displacement along one of the X axis and the Y axis, a rotation about an other of the X axis and the Y axis and a rotation about the Z axis, and the second interferometer unit having two measuring axes, for measuring a displacement along said other of the X axis and the Y axis and a rotation about said one of the X axis and the Y axis, the interferometer mirrors comprising reflecting side faces of the object support, and the accuracy of said device being such that each sub-area of an object surface can be accurately and directly positioned with respect to the reference without the use of additional alignment means for each sub-area.

16. An apparatus for repetitively imaging a mask pattern on a substrate, which apparatus comprises a mask holder, a substrate table with a substrate support, a projection lens system arranged between the mask holder and the substrate support, an alignment device for globally aligning the substrate with respect to the mask pattern, a levelling device for locally levelling the substrate and a displacement and positioning device for the substrate, characterized in that the displacement and positioning device is a device for accurately displacing and positioning an object with respect to a reference, said object being rigidly fixed to an object holder forming part of and being supported in an object stage, said device comprising the object stage, an X-Y-$\phi z$ drive for moving the object and an interferometer system comprising interferometer mirrors, for measuring displacements of the object along an X axis and a Y axis and a rotation $\phi z$ about a Z axis of a three-axis system of coordinates, the interferometer system comprising five measuring axes and being capable of measuring tilts of the object about the X and Y axes, the interferometer mirrors comprising reflecting side surfaces of the object holder and the interferometer mirrors thereby being stationary with respect to the object such that the interferometer system directly measures all object movements including movements due to stage movements, and the accuracy of said device being such that each sub-area of an object surface can be accurately and directly positioned with respect to the reference without the use of additional alignment means for each sub-area, which device can successively be driven in a first mode, in which the substrate is globally positioned with respect to the mask pattern by means of the alignment and interferometer measuring signals, and in second mode in which a sub-area of the substrate is positioned with respect to the mask pattern by means of the interferometer measuring signals only.

17. An apparatus for repetitively imaging a mask pattern on a substrate, which apparatus comprises a mask holder with a substrate support, a projection lens system arranged between the mask holder and the substrate support, an alignment device for globally aligning the substrate with respect to the mask pattern, a focusing device and a displacement and positioning device for the substrate, characterized in that the displacement positioning device is a device for accurately displacing and positioning an object with respect to a reference, said object being rigidly fixed to an object holder forming part of and being supported in an object stage, said device comprising the object stage, an X-Y-φz drive for moving the object and an interferometer system comprising interferometer mirrors, for measuring displacements of the object along an X axis and a Y axis and a rotation φz about a Z axis of a three-axis system of coordinates, the interferometer system comprising five measuring axes and being capable of measuring tilts of the object about the X and Y axes, the interferometer mirrors comprising reflecting side surfaces of the object holder and the interferometer mirrors thereby being stationary with respect to the object such that the interferometer system directly measures all object movements including movements due to stage movements, and the accuracy of said device being such that each sub-area of an object surface can be accurately and directly positioned with respect to the reference without the use of additional alignment means for each sub-area, in that the interferometer system has a sixth, reference, axis whose measuring beam cooperates with a stationary reflector, and in that the output signal of a detector associated with the reference axis is applied to an electronic signal processing device which supplies control signals for correcting at least one of the following parameters:

the wavelength of the projection beam the pressure within the projection lens holder the mutual distances between the lens elements of the projection lens system the composition of the medium in one or more of the compartments of the projection lens holder the temperature within the projection lens holder the zero adjustment of the alignment device the zero adjustment of the focusing device the magnification of the projection lens system.

* * * * *